United States Patent [19]
Ikegami

[11] Patent Number: 6,112,208
[45] Date of Patent: Aug. 29, 2000

[54] DATA COMPRESSING METHOD AND APPARATUS TO GENERATE BIT MAPS IN ACCORDANCE WITH EXTRACTED DATA SYMBOLS

[75] Inventor: Fujio Ikegami, Kawasaki, Japan

[73] Assignee: Fujitsu Limited, Kawasaki, Japan

[21] Appl. No.: 09/040,319

[22] Filed: Mar. 18, 1998

[30] Foreign Application Priority Data

Aug. 25, 1997 [JP] Japan .................................. 9-228341

[51] Int. Cl.$^7$ ...................................................... G06F 9/00
[52] U.S. Cl. ............................................. 707/101; 710/68
[58] Field of Search ................................ 707/101; 710/68

[56] References Cited

U.S. PATENT DOCUMENTS

| | | | |
|---|---|---|---|
| 4,782,325 | 11/1988 | Jeppsson et al. | 710/68 |
| 5,363,098 | 11/1994 | Antoshenkov | 341/95 |
| 5,517,586 | 5/1996 | Knowlton | 382/292 |
| 5,777,749 | 7/1998 | Noda et al. | 358/261.3 |
| 5,818,965 | 10/1998 | Davies | 382/225 |
| 5,835,638 | 11/1998 | Rucklidge et al. | 382/257 |
| 5,852,710 | 12/1998 | Shiohara et al. | 395/115 |

*Primary Examiner*—Jean R. Homere
*Attorney, Agent, or Firm*—Staas & Halsey LLP

[57] ABSTRACT

When input data composed of a symbol string is compressed, bit maps are used. In each bit map, "1" is set to a bit that represents the position of a relevant symbol of the symbol string. In contrast, "0" is set to a bit that represents the position of another symbol of the symbol string. When compressed data is expanded, symbols are expanded in the order thereof. Thus, the positions of symbols that have been expanded are omitted from each bit map. Consequently, each bit map can be shortened and thereby the compression ratio can be improved. Since the length of each bit map is variable, a value of which (the number of symbols expanded by corresponding bit map–2) is added as information for expanding symbols from each variable bit map of the compressed data correctly. In addition, to distinguish data having a bit map from data having no bit map, a flag that represents the presence of a bit map is added to the compressed data.

22 Claims, 13 Drawing Sheets

SYMBOL STRING     aabcadeabcedbcddddeeeaff

| SYMBOL | BIT MAP | DATA LENGTH |
|---|---|---|
| a | 110010010000000000000100 | 8 + 25 = 33 |
| b | 001000001000100000000000 | 8 + 25 = 33 |
| c | 000100000100010000000000 | 8 + 25 = 33 |
| d | 000001000001001111100000 | 8 + 25 = 33 |
| e | 000000100010000000011100 | 8 + 25 = 33 |
| f | 000000000000000000000011 | 8 + 25 = 33 |

FIG. 3A

SYMBOL STRING     aabcadeabcedbcddddeeeaff

| SYMBOL | ON-COUNT | BIT MAP | DATA LENGTH |
|---|---|---|---|
| a | 100 | 11001001000000000000001 | 8 + 3 + 23 = 34 |
| b | 010 | 0010000010001 | 8 + 3 + 13 = 24 |
| c | 010 | 00010000010001 | 8 + 3 + 14 = 25 |
| d | 110 | 0000010000010011111 | 8 + 3 + 19 = 30 |
| e | 100 | 0000001000100000000111 | 8 + 3 + 22 = 33 |
| f | 001 | 0000000000000000000000011 | 8 + 3 + 25 = 36 |

FIG. 3B

SYMBOL STRING aabcadeabcedbcdddddeeeaff

| SYMBOL | ON-COUNT | BIT MAP | DATA LENGTH |
|---|---|---|---|
| a | 100 | 11001001000000000000001 | 8 + 3 + 23 = 34 |
| b | 010 | 100010001 | 8 + 3 + 9 = 20 |
| c | 010 | 1001001 | 8 + 3 + 7 = 18 |
| d | 110 | 100111111 | 8 + 3 + 9 = 20 |
| e | 100 | 11111 | 8 + 3 + 5 = 16 |
| f | 001 | 11 | 8 + 3 + 2 = 13 |

FIG. 4A

SYMBOL STRING aabcadeabcedbcdddddeeeaff

| SYMBOL | ON-COUNT | BIT MAP | DATA LENGTH |
|---|---|---|---|
| a | 011 | 11001001 | 8 + 3 + 8 = 19 |
| b | 010 | 100010001 | 8 + 3 + 9 = 20 |
| c | 010 | 1001001 | 8 + 3 + 7 = 18 |
| d | 110 | 100111111 | 8 + 3 + 9 = 20 |
| e | 100 | 11111 | 8 + 3 + 5 = 16 |
| a | 000 | 1 | 8 + 3 + 1 = 12 |
| f | 001 | 11 | 8 + 3 + 2 = 13 |

FIG. 4B

SYMBOL STRING      aabcadeabcedbcdddddeeeaff

| SYMBOL | ON-COUNT | BIT MAP | DATA LENGTH |
|---|---|---|---|
| a | 011 | 1001001 | 8 + 3 + 7 = 18 |
| b | 010 | 00010001 | 8 + 3 + 8 = 19 |
| c | 010 | 001001 | 8 + 3 + 6 = 17 |
| d | 110 | 00111111 | 8 + 3 + 8 = 19 |
| e | 100 | 1111 | 8 + 3 + 4 = 15 |
| a | 000 |  | 8 + 3 + 0 = 11 |
| f | 001 | 1 | 8 + 3 + 1 = 12 |

FIG. 5A

SYMBOL STRING      aabcadeabcedbcdddddeeeaff

| SYMBOL | FLAG | ON-COUNT | BIT MAP | DATA LENGTH |
|---|---|---|---|---|
| a | 1 | 010 | 1001001 | 8 + 1 + 3 + 7 = 19 |
| b | 1 | 001 | 00010001 | 8 + 1 + 3 + 8 = 20 |
| c | 1 | 001 | 001001 | 8 + 1 + 3 + 6 = 18 |
| d | 1 | 101 | 00111111 | 8 + 1 + 3 + 8 = 20 |
| e | 1 | 011 | 1111 | 8 + 1 + 3 + 4 = 16 |
| a | 0 |  |  | 8 + 1 + 0 + 0 = 9 |
| f | 1 | 000 | 1 | 8 + 1 + 3 + 1 = 13 |

FIG. 5B

20 INPUT DATA

```
i = 0 1 2 3 4 5 6   POSITION
    A A A B C A D
```

22 COMMON MAP (FINALLY PROCESSED RESULT)
1 1 1 0 0 1 0

23 OUTPUT MAP (FINALLY PROCESSED RESULT)
1 1 1 0 0 1 0

25 COMPRESSED DATA

| SYMBOL | FLAG | ON-COUNT | BITMAP |
|--------|------|----------|--------|
| A | 1 | 010 | 11001 |
| ABSENCE | 0 | | |
| ABSENCE | 0 | | |
| B | | | |
| C | | | |
| ABSENCE | 0 | | |
| D | | | |

| | COMMON MAP | OUTPUT MAP |
|--|------------|------------|
| FIRST SYMBOL (A) | 1 1 1 0 0 1 0 | 1 1 1 0 0 1 0 |
| SECOND SYMBOL (A) | 1 0 0 1 0 0 0 | 0 0 0 0 0 0 0 |
| THIRD SYMBOL (A) | 1 0 1 0 0 0 0 | 0 0 0 0 0 0 0 |
| FOURTH SYMBOL (B) | 1 0 1 0 0 0 0 | 1 0 0 0 0 0 0 |
| FIFTH SYMBOL (C) | 1 1 0 0 0 0 0 | 1 0 0 0 0 0 0 |
| SIXTH SYMBOL (A) | 1 0 0 0 0 0 0 | 0 0 0 0 0 0 0 |
| SEVENTH SYMBOL (D) | 1 0 0 0 0 0 0 | 1 0 0 0 0 0 0 |

F I G. 1 0

```
                    SYMBOL  FLAG                    FLAG
                        FLAG  ON-COUNT  BIT MAP        SYMBOL
                                              SYMBOL
25 COMPRESSED DATA      A 1 0 1 0 1 1 1 0 0 1  B 0  C 0  D 0
                        28 COMMON MAP FLAG           oncnt  29 SYMBOL BUFFER
FIRST SYMBOL (A)        0 0 0 0 0 0 0  1              4    A A A   A
                        1 1 1 0 0 0 1 0                    A A A   (OUTPUT AAA)
                        0 0 1 0 0 0 0 0                            A      (SHIFT LEFTWARD)

SECOND SYMBOL (B)       0 0 1 0 0 0 0  0              1    B   A
                        1 0 1 0 0 0 0 0                    B   A   (OUTPUT B)
                        0 1 0 0 0 0 0 0                        A      (SHIFT LEFTWARD)
THIRD SYMBOL (C)        0 1 0 0 0 0 0  0              1    C   A
                        1 1 0 0 0 0 0 0                    C   A   (OUTPUT CA)
                        0 0 0 0 0 0 0 0                               (SHIFT LEFTWARD)
FOURTH SYMBOL (D)       0 0 0 0 0 0 0  0              1    D
                        1 0 0 0 0 0 0 0                    D       (OUTPUT D)
```

FIG. 13

DATA COMPRESSING METHOD AND APPARATUS TO GENERATE BIT MAPS IN ACCORDANCE WITH EXTRACTED DATA SYMBOLS

BACKGROUND OF THE INVENTION

1. Field of the Invention

The present invention relates to a data compressing method and an apparatus thereof.

2. Description of the Related Art

So far, computers have been widely used. In the communication field, data communication in association with multimedia is becoming attractive. However, when computers have been widely used, requirements for data handled by the computers and application software that runs thereon have become large. In addition, the amount of data handled by the computers tends to increase.

For example, in the Internet or the like, a distribution method of which a file of application software is downloaded from a remote server to a personal computer and the downloaded application is installed to the personal computer has been routinely used. In this case, to download application software, the user must keep a telephone line connected to such a network. On the other hand, because of an increase of functions of application software, the size of a file containing the application software is also becoming very large. Thus, it sometimes takes a couple of hours to complete a downloading operation for application software. Consequently, the communication fee increases.

In addition to performing the downloading operation of such a file, as data processed by computers increases, the amount of data stored in each storing medium such as a floppy disk and a hard disk tends to increase.

As the amount of data handled by computers increases, there are problems on effective uses of storage mediums, reduction of data transmission time, and so forth. To solve such problems, data is compressed in a special manner. The compressed data is transferred and stored in a particular storing medium. The original data is expanded (restored) in a particular expanding method corresponding to the compressing method.

As typical examples of several known data compressing methods, there are a Huffman coding method and a Lempel-Ziv method. In both the methods, a data file is treated as a set of symbols. The symbols are effectively reproduced. In other words, a data file composed of binary data of "0s" and "1s" can be represented as symbol string in such a manner that each byte of the data file is correlated with one character symbol.

In the Huffman coding method, all pieces of input data are read. The occurrence probability of each symbol in the input data is obtained. Next, an occurrence probability table that represents the occurrence probability of each symbol is generated. Next, a code is added to each symbol so as to identify the symbol in a predetermined method such as Huffman tree corresponding to the occurrence probability table. In other words, a code with a short bit length is assigned to a symbol with a large occurrence probability. In contrast, a code with a long bit length is assigned to a symbol with a small occurrence probability. Thereafter, the input data is read once again. Each symbol of the input data is substituted with an assigned code corresponding to the occurrence probability table in the predetermined method (for example, Huffman tree method). At the beginning of the compressed data in the Huffman coding method, an occurrence probability table that represents the occurrence probability of each symbol is output. Thus, when the compressed data is expanded, with reference to the occurrence probability table at the beginning of the compressed data, each code is substituted with a relevant symbol in the same manner as the compressing method.

In normal data, one symbol is represented with a predetermined number of bits. Thus, the amount of input data is represented with (the number of bits that represents a symbol)×(the number of symbols contained in data). According to the Huffman coding method, as the occurrence probability of a symbol is large, the number of bits of a code assigned thereto is small. Thus, the amount of data can be reduced for such bits.

In the Lempel-Ziv method, symbol strings in input data are registered to a dictionary. The symbol strings are substituted with indexes of the dictionary. As the input data is being read, the dictionary is generated. Whenever a new symbol string appears, it is registered in the dictionary and substituted with an index. There are two dictionary generating methods that are referred to as LZ77 method and LZ78 method.

In the LZ77 method, symbols that have appeared in the past of predetermined kbits are registered to the dictionary. Symbols of input data are substituted with indexes registered in the dictionary. When a symbol of input data has not been registered in the dictionary, a code representing that the symbol has not been registered in the dictionary is added to the symbol and then output as is.

In the LZ78 method, all symbols or symbol strings that have appeared in the past of input data are registered to a dictionary. The symbols or symbol strings of the input data are substituted with indexes of the dictionary.

In the Huffman coding method, the occurrence probability table should be placed at the beginning of compressed data so as to expand the compressed data. Thus, when the amount of data is small, the effect of the data compression is lost.

In the Lempel-Ziv method, the effect of the data compression cannot be obtained unless symbol strings have been registered in a dictionary to some extent.

In other words, in each of these compressing methods, when the amount of data is small, the effect of the data compression is lost. That is, when a small amount of data is compressed, the amount of resultant data increases.

SUMMARY OF THE INVENTION

An object of the present invention is to provide a data compressing method and an apparatus thereof that do not depend on the amount of data.

A first aspect of the present invention is a data compressing method, comprising the steps of reading data to be compressed, extracting symbols from the data that has been read, generating bit maps that represent the positions of the extracted symbols in the data that has been read, and combining the extracted symbols and the relevant bit maps and outputting the resultant data as compressed data.

A second aspect of the present invention is a data compressing apparatus, comprising an input data extracting unit for reading data to be compressed and extracting symbols from the data that has been read, a bit map generating unit for generating bit maps that represent the positions of the extracted symbols in the data that has been read, and an outputting unit for combining the extracted symbols and the relevant bit maps and outputting the resultant data as compressed data.

A third aspect of the present invention is a data expanding method, comprising the steps of reading compressed data generated by a data compressing method comprising steps of reading data to be compressed, extracting symbols from the data that has been read, generating bit maps that represent the positions of the extracted symbols in the data that has been read, and combining the extracted symbols and the relevant bit maps and outputting the resultant data as compressed data, reading a symbol and a bit map thereof from the compressed data, and outputting the symbol to the position corresponding to the bit map.

A fourth aspect of the present invention is a data expanding apparatus, comprising a reading unit for reading compressed data generated by a data compressing apparatus comprising an input data extracting unit for reading data to be compressed and extracting symbols from the data that has been read, a bit map generating unit for generating bit maps that represent the positions of the extracted symbols in the data that has been read, and an outputting unit for combining the extracted symbols and the relevant bit maps and outputting the resultant data as compressed data, and expanded data outputting unit for reading a symbol and a bit map thereof from the compressed data and outputting the symbol to the position corresponding to the bit map.

When original data is compressed with a bit map, it is not necessary to output an occurrence probability table at the beginning of compressed data. In addition, unlike with a method using a dictionary, the compressing method can be used irrespective of the amount of data to be compressed. Thus, data can be compressed regardless of whether the amount of data is large or small.

In addition, according to the data expanding method or the expanding apparatus of the present invention, a symbol and a bit map corresponding thereto of compressed data are read. The symbol is placed at the position represented by the bit map. When this operation is performed for all data (symbols and bit maps corresponding thereto) of the compressed data, data that has been compressed by the data compressing method or the data compressing apparatus according to the present invention can be expanded to the original data.

In the data compression, a bit map is structured in such a manner that the positions of symbols that have been extracted are represented in the order of occurrence. Bits that represent the absence of the symbol are deleted from the bit map in the range from the last bit of the symbol to the end of the bit map. The resultant bit map is output as compressed data. This method is effective to delete redundant bits. At this point, since the length of a bit map composed of bits that are "0s" and "1s" is variable, a counter value that represents the number of bits of the bit map is output along with the bit map as compressed data.

When each symbol of data that has been read is compressed in the order of occurrence, bits that represent the positions of symbols that have been compressed can be deleted from a bit map corresponding to a symbol that will be compressed. Thus, bits that are not necessary for expanding the compressed data can be deleted from bit maps. Thus, the amount of compressed data can be reduced. In this case, since the first bit of each bit map represents the presence of a symbol, the bit that represents the present of a symbol can be omitted.

When the same type of symbols are present in different positions of data, bits that represent the absence of this type of symbols are present. In this case, when this type of symbols, which are the same symbols, are processed as different symbols, the bit length of the bit map can be decreased.

As described above, when a bit map is shortened, there is a symbol that requires neither a bit map nor a counter value. Thus, with a flag that represents the presence/absence of a bit map and a counter value corresponding to the symbol, a bit map and a counter value that are unnecessary can be omitted from the compressed data. Consequently, data can be effectively compressed.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 3A and 3B are diagrams for explaining a data compressing method (No. 1) according to the present invention;

FIGS. 4A and 4B are diagrams for explaining a data compressing method (No. 2) according to the present invention;

FIGS. 5A and 5B are diagrams for explaining a data compressing method (No. 3) according to the present invention;

FIG. 10 shows a sample of data for explaining the data compressing process according to the embodiment of the present invention;

FIG. 13 shows a sample of data for explaining the data expanding process according to the embodiment of the present invention.

DESCRIPTION OF PREFERRED EMBODIMENTS

Figure 1:
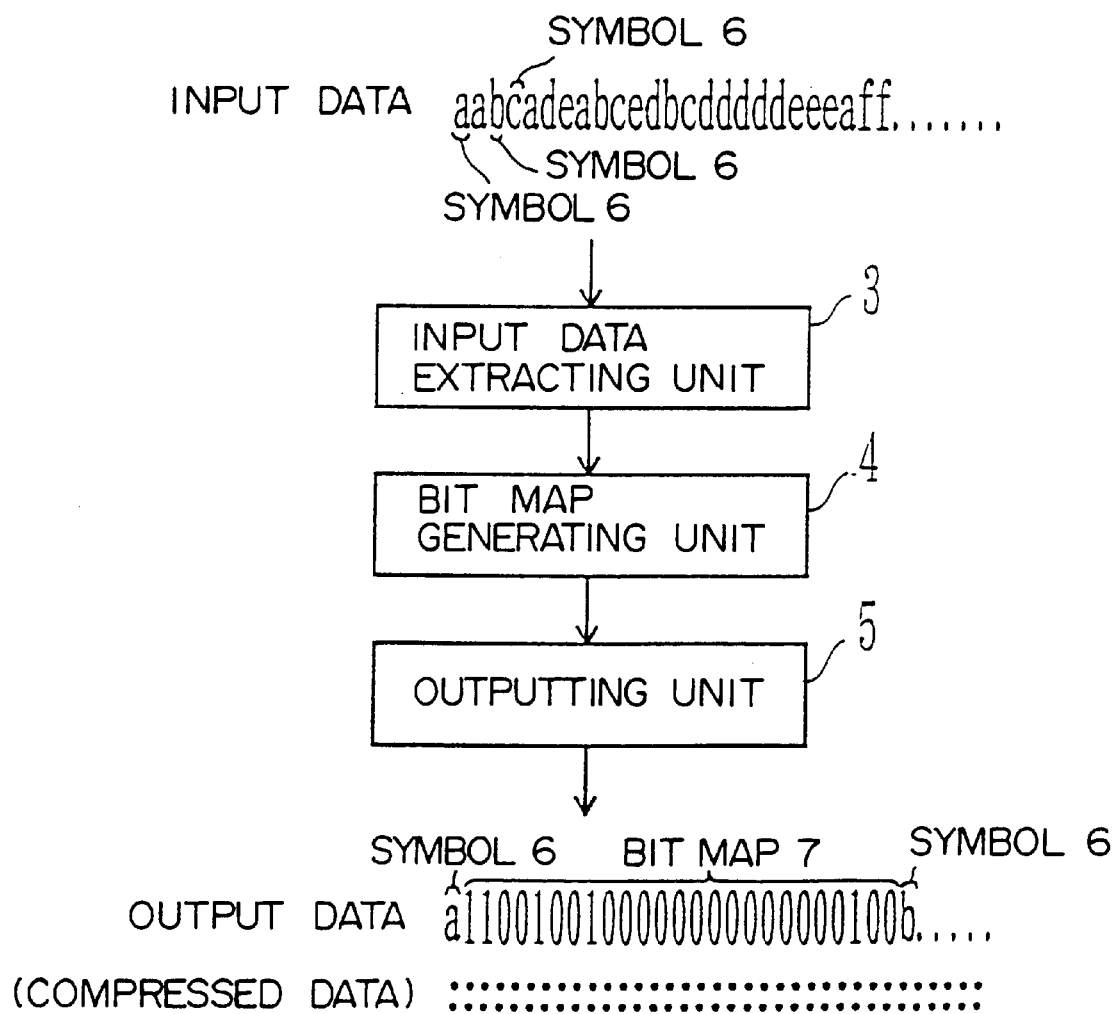
FIG. 1 is a schematic diagram showing the theoretical structure of the present invention.

FIG. 1 is a schematic diagram showing the theoretical structure of the present invention.

The present invention includes an input data extracting unit 3, a bit map generating unit 4, and an outputting unit 5. The input data extracting unit 3 receives input data and extracts symbols 6 from the input data. The bit map generating unit 4 generates a bit map 7 that represents the positions of the extracted symbols 6 in the input data. The outputting unit 5 combines the symbols 6 extracted by the input data extracting unit 3 and the bit map 7 generated by the bit map generating unit 4 and outputs the resultant data.

The input data is generally represented by a symbol string composed of "0s" and "1s". When one byte (eight bits) is correlated with one symbol, input data can be treated as a symbol string such as alphabetic characters. The input data extracting unit 3 reads the input data and extracts symbols from the input data ("a", "b", "c", and so forth in FIG. 1).

Next, the bit map generating unit 4 generates the bit map 7 that represents the positions of the symbols 6 in the input data. The bit map 7 shown in FIG. 1 represents the positions of the symbol "a" in the input data. Referring to FIG. 1, the bit map 7 corresponding to the symbol "a" is "11001001000000000000000100". This bit map 7 represents that the symbol "a" is present at the 1st, 2nd, 5th, 8th, and 23rd positions in the input data. In other words, positions with "1" in the bit map 7 represent positions of a relevant symbol in the input data.

Thus, when the symbols 6 (namely, "a", "b", "c" and so forth) in the input data are output in combination with the bit maps 7, the input data can be compressed. In addition, when redundant bits are deleted from each bit map, the compression ratio of the output data against the input data can be improved. A practical method for deleting such redundant bits will be described later.

Figure 2:
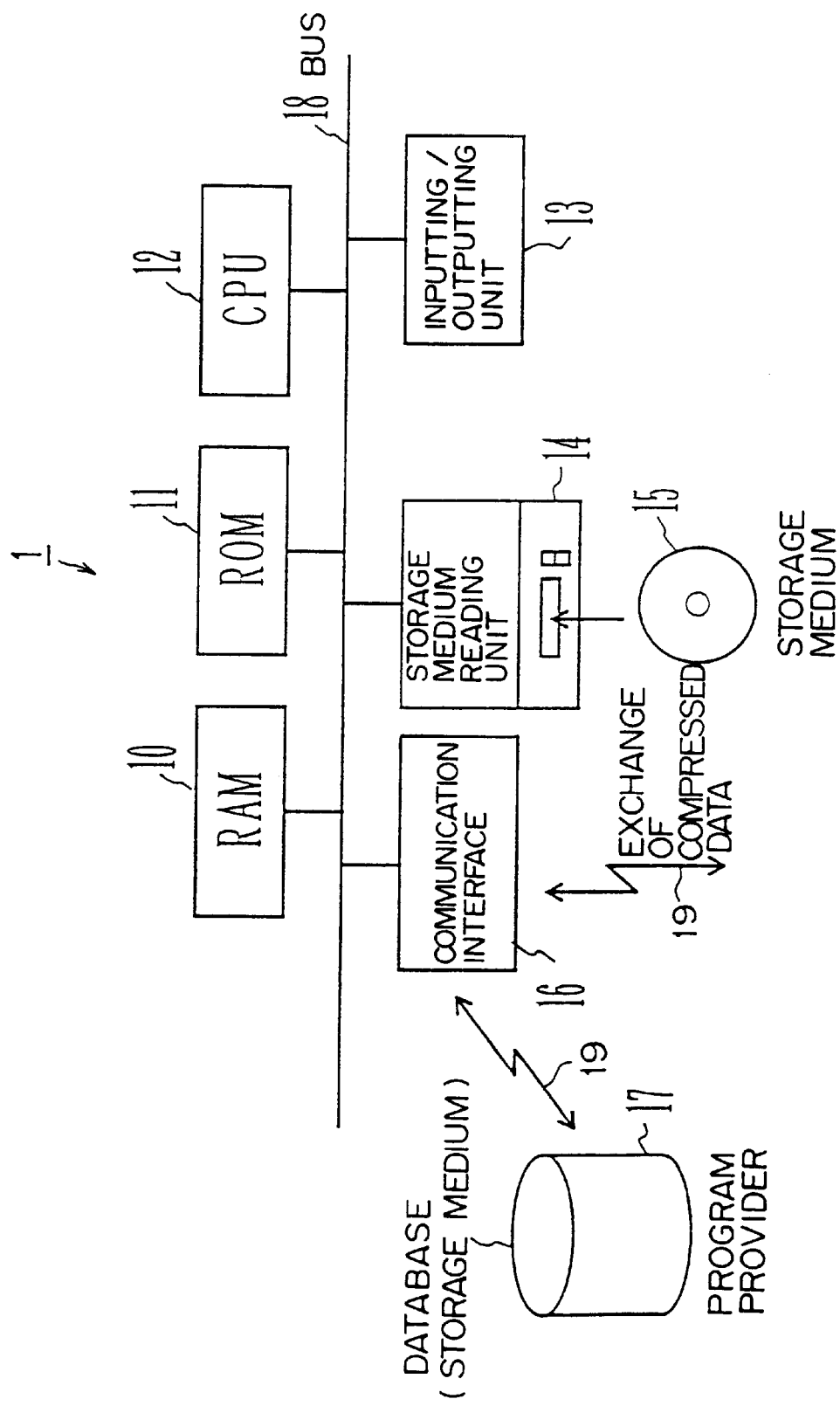
FIG. 2 is a schematic diagram showing an example of the structure of an apparatus that perform a data compressing process according to the present invention.

FIG. 2 is a schematic diagram showing an example of the structure of hardware of a computer 1 that performs data compressing process/data expanding process according to an embodiment of the present invention.

The computer 1 shown in FIG. 2 comprises a CPU 12 and a RAM 10. The CPU 12 accomplishes the data compressing process/data expanding process according to the embodiment of the present invention by executing a particular program (data compressing program/data expanding program). The RAM 10 loads the program in such a manner that the CPU 12 can execute the program. The CPU 12 and the RAM 10 exchange data through a bus 18 and accomplish the data compressing process/data expanding process. A ROM 11 stores a system program (for example, system software such as an OS and device drivers, and BIOS) that controls the operations of an inputting/outputting unit 13, a storage medium reading unit 14, and a communication interface 16. When the power of the computer 1 is turned on, the CPU 12 loads the system program from the ROM 11 to the RAM 10 and executes the system program. Alternatively, the data compressing process program/data expanding process program according to the embodiment can be stored in the ROM 11 beforehand. In this case, the CPU 12 loads the data compressing/expanding process program from the ROM 11 to the RAM 10 and executes the data compressing/expanding process program.

The inputting/outputting unit 13 includes a display unit, a keyboard, a mouse, a speaker, and so forth so as to accomplish an interface between the user and the computer 1. The inputting/outputting unit 13 includes at least a keyboard and a display unit. The keyboard allows the user to designate a data file to be compressed or expanded with a command. The display unit displays an input command and a compressing/expanding state of a data file. Alternatively, the user designates a data file to be compressed or expanded by clicking an icon with a mouse on a GUI screen.

A storage medium 15 records a program or data in such a manner that the computer 1 can read it. When the data compressing/expanding process program is recorded on the storage medium 15, the program is read from the storage medium 15 by the storage medium reading unit 14 so as to cause the CPU 12 to execute the program. Under the control of the CPU 12, the data compressing/expanding process program that is read from the storage medium 15 by the storage medium reading unit 14 is loaded to the RAM 10 in such a manner that the CPU 12 can execute the data compressing/expanding process program. Thereafter, the CPU 12 executes the data compressing/expanding process program. Alternatively, a data file to be compressed or expanded is recorded on the storage medium 15. In this case, the data file is read from the storage medium 15 and then compressed or expanded. The storage medium 15 is, for example, a portable storage medium such as a floppy disk or a CD-ROM that stores the data compressing/expanding process program in such a manner that the computer 1 can read the data compressing/expanding process program.

In addition to the above-described structural elements, the bus 18 has a communication interface 16 that allows data to be exchanged with another computer. For example, with the communication interface 16 and DCE (Data Circuit terminating Equipment) (not shown) such as a modem connected thereto, the user may access a database 17 that a program provider provides programs through the network 19 and downloads the data compressing/expanding process program according to the embodiment stored in the database 17 to the computer 1 so that the CPU 12 executes the program.

In addition, the communication interface 16 allows the DCE to send compressed data to another computer through the network 19 and to receive compressed data from another computer through the network 19. The received compressed data is expanded by the data compressing/expanding process program according to the embodiment so that the computer 1 can use the expanded data.

The data compressing/expanding process program may be downloaded from an application server to the computer 1 through LAN such as Intranet.

Next, the data compressing method according to the embodiment of the present invention will be described.

FIG. 3A is a schematic diagram for explaining the concept of the data compressing method according to the embodiment of the present invention.

FIG. 3A shows a symbol string to be compressed as an alphabetic symbol string. In this embodiment, the positions of one type of symbols contained in the symbol string are represented as a bit map. For example, the symbol string includes symbols "a" at the 1st, 2nd, 5th, 8th, and 23rd positions. In the bit map of the symbol "a", the values of the 1st, 2nd, 5th, 8th, and 23rd bits are "1", whereas the values of the other bits are "0". Consequently, the bit map represents the positions of the symbols "a" in the symbol string.

This representation method also applies to the other symbols. Since symbols "b" are present at the 3rd, 9th, and 13th positions of the symbol string, a bit map of the symbols "b" is generated so that the values of the 3rd, 9th, and 13th bits are "1" and the values of the other bits are "0". Likewise, bit maps of symbols "a" to "f" are generated and substituted with the original symbol string. In this case, at the beginning of each bit map, a relevant symbol (for example, "a" or "b") is output so as to represent which bit map corresponds to which symbol.

Next, the compression ratio of the above-described method will be calculated. Although the compression ratio can be calculated in various manners, in this embodiment, the following definition is used.

Compression ratio=($\Sigma$(number of bits necessary for representing a symbol+number of bits of a bit map)/(number of bits necessary for representing a symbol×length of input symbol string)  (1)

where the summation of the numerator is performed for all types of symbols contained in the original symbol string.

In computers, since each alphabetic character is usually represented with eight bits, to calculate the compression ratio in the above-described manner, the number of bits necessary for representing each symbol is assumed to be eight bits.

In the original symbol string at the top of FIG. 3A, each character is composed of eight bits. The number of symbols contained in the symbol string is 25. Thus, the total number of bits of the original symbol string is 8×25=200 bits. The total number of bits of the original symbol string is the denominator of the formula (1). On the other hand, as shown at a right portion of FIG. 3A, the number of bits of data compressed by the method according to the embodiment is 33 bits (=8 bits for each symbol and 25 bits for the bit map thereof). In addition, since there are six types of symbols "a" to "f", the total number of bits is 6×33 (=198 bits). The total number of bits represents the numerator of the formula (1). Thus, the compression ratio becomes 198/200=0.99. To obtain the effect of the data compression, the compression ratio should be less than 1. Consequently, the number of types of symbols in the above-described method should be eight or less (however, in this case, it is assumed that the length of data to be compressed is very large). Such a restriction is applied in the case that only the concept of the embodiment is used. However, as will be described later, with an effective representation of a bit map, data can be effectively compressed without such a restriction.

FIG. 3B is a schematic diagram showing a bit map representation that is more effective than that shown in FIG. 3A.

FIG. 3A shows that there are many "0" strings on the right of the bit maps. The "0" strings represent that relevant symbols are absent in the rear portions of the relevant symbol strings. Thus, when each symbol string is expanded from the beginning, the relevant "0" string in the rear portion of the bit map is not necessary to expand the symbol string. In other words, when a "0" string is followed by a "1", the relevant symbol does not appear until a next "1" appears. Thus, in this case, the "0" string should be placed in the bit map. However, since a "0" string that lasts to the end of the bit map is not necessary, this "0" string can be deleted from the bit map.

In FIG. 3A, since the length of each bit map is fixed to 25 bits, when data is expanded, the end of each bit map can be detected. However, when the length of each bit map is variable, the end of each bit map cannot be detected as with the case shown in FIG. 3B.

To solve this problem, a value that represents (number of symbols to be expanded corresponding to the relevant bit map−1) is output at the beginning of the bit map as an index that represents the length of the bit map. This value is defined as on-count. In the example shown in FIG. 3B, the on-count is represented with three bits. Thus, in the example shown in FIG. 3B, since the length of each bit map can be variable, the compression ratio can be more improved than that in the example shown in FIG. 3A.

At a right portion of FIG. 3B, the data length of each bit map is shown. The data length of each symbol is 8 bits for each symbol, 3 bits for the on-count, and the variable bit length of the bit map. By adding the data length of each of the symbols "a" to "f", the total data length of these symbols "a" to "f" is obtained. In the case shown in FIG. 3B, the total data length is 182 bits. By dividing the total bit length (182 bits) by the bit length of the original symbol string (200 bits), the compression ratio that is 0.91 can be obtained.

Thus, in the case shown in FIG. 3B, due to the structure of variable length bit maps, although the bit length increases corresponding to the on-count, since "0" strings that last to the end of the individual bit maps can be omitted, the total data amount decreases.

FIG. 4A is a diagram for explaining a method for deleting unnecessary bits with "0s" from each bit map of FIG. 3B and thereby improving the compression ratio.

In FIG. 3B, the bit map of the second symbol "b" starts with "001". However, symbols "a" are present at the first "00" positions of the bit map of the symbol "b". When compressed data is expanded in the order of occurrence of the symbols "a", "b", . . . , "f" of the original symbol string, overlay of the early expanded symbols with the later expanded symbols does not occur. Thus, a "0" string at the beginning of a symbol that is expanded later and a "0" string that is present between "1s" and that corresponds to the positions of symbols that are expanded before can be omitted.

FIG. 4A shows compressed data in which unnecessary "0" strings have been omitted from the bit maps shown in FIG. 3A. In this case, symbols are expanded in the order of occurrence of the symbols "a" to "f". When the structures shown in FIGS. 3B and 4A are compared, since bits of unnecessary "0" strings are omitted, the bit length of each bit map decreases and thereby the compression ratio further improves. When the compression ratio is calculated, since the total data length of the compressed data is 121 bits and the data length of the original data is 200 bits, the compression ratio is 0.61.

In the method shown in FIG. 4A, data is expanded in the order of occurrence of symbols "a" to "f" in the original symbol string. However, according to the present invention, the order of symbols to be expanded is not limited. In other words, symbols may be expanded in the descending order from symbol "f" to symbol "a". Alternatively, symbols "a" to "f" may be expanded at random. However, in this case, bit maps are generated corresponding to the order of symbols to be expanded.

In FIG. 4A, only the bit map of the symbol "a" that is expanded at first is very long. Next, a method for further decreasing the bit length of each bit map will be described.

FIG. 4B is a diagram for explaining the method for dividing a bit map of a symbol "a".

In this case, symbols (in an original symbol string) are expanded in the order from the symbol "a" to a symbol "f". That is, this case assumes that the symbols are compressed and expanded in the order of occurrence in the original symbol string.

The bit map of the symbol "a" shown in FIG. 4B includes the bit string of "0s", which continues from the bit "1" located at the fourth position from the left in the bit map shown in FIG. 4A. The second symbol "a" represented by the bit map "1" following the string of "0s" is treated as a different symbol. That is, the above described second symbol "a" is placed after the symbol "e" as if it is a symbol different from the first symbol "a".

In such a case, the bit maps of the respective symbols are generated in the order of occurrence in the original symbol string. By expanding the data in the order from the first symbol "a", also the second symbol "a" (in the lower position) can be recovered to the correct position. Here, the symbol "a" in the lower position must be placed so that it can be inserted after the symbol which can be recovered in the correct position in the original symbol string, when the bit maps are expanded from the first symbol "a".

With the method shown in FIG. 4B, since the total of the data lengths shown on the right side of this figure is 118 bits and the bit length of the original symbol string is 200 bits, the compression ratio becomes 0.59, which shows a further improvement in compression.

Note that the bit length of an on-count is set to 3 bits in FIGS. 3B, 4A, and 4B. In this case, the number of bits "1" which can be registered in one bit map is 8. Therefore, the on-count of 3 bits lengths cannot cope with the case where a symbol appears 8 or more times in the original symbol string. As shown in FIG. 4B, however, the case where there is a symbol which appears in the original symbol string more times than a maximum value of an on-count having a predetermined bit length is made acceptable by dividing the symbol having a long bit map and generating its compressed data. Of course, it is possible to elongate the bit length of the on-count in FIGS. 3B, 4A, and 4B.

FIG. 5A shows the omission of "1" at the beginnings of the respective bit maps shown in FIG. 4B.

That is, the beginnings of the bit maps of all the symbols are "1" in FIG. 4B, which indicates the positions in which the corresponding symbols appear first. As long as a symbol is output, however, it means that the symbol appears in the original symbol string once at least.

Thus, even if the leading "1" is omitted from the bit map of each symbol shown in FIG. 4B, no problem takes place. Thus, in FIG. 5A, these "1s" are omitted. Although the leading "1" is omitted from each bit map, the on-count value thereof is not changed.

The bit length of the bit map of each symbol in the method shown in FIG. 5A is smaller than that in the method shown in FIG. 4B by one bit. Thus, the total bit length in the method shown in FIG. 5A is 111 bits. Since the bit length of the original symbol string is 200 bits, the compression ratio in the method shown in FIG. 5A is 0.56.

FIG. 5B is a schematic diagram for explaining a method of which a flag that represents the presence of a bit map is used in addition to an on-count.

In FIG. 5A, the second symbol "a" does not have a bit map. Thus, when the second symbol "a" is expanded, it does not require an on-count. Consequently, only the second symbol "a" is required. As with the second symbol "a" in FIG. 5A, when symbols disperse in the original symbol string, many symbols do not have bit maps.

In the method shown in FIG. 5A, each symbol requires at least 11 bits that are 8 bits of the symbol and 3 bits of an on-count. Thus, in the case of the second symbol "a", it requires redundant data. To solve this problem, as shown in FIG. 5B, a flag that represents the presence/absence of an on-count and a bit map for each symbol is used. When there are an on-count and a bit map for a particular symbol, "1" is set to the flag. Thus, as with the second symbol "a", when there is neither an on-count nor a bit-map, "0" is set to the flag.

With this flag, an on-count and a bit map that are redundant can be omitted. In the method shown in FIG. 5B, the total data length is 114 bits. Since the bit length of the original symbol string is 200 bits, the compression ratio in the method shown in FIG. 5B is as small as 0.57. In the method shown in FIG. 5B, with the flag that represents the presence/absence of an on-count and a bit map, the compression ratio slightly deteriorates in comparison with the method shown in FIG. 5A. However, in the real data, the effect of data compression with the flag is remarkably high.

In FIG. 5B, since the first one bit of each bit map in FIG. 4B is omitted, the value of the on-count in FIG. 5B is smaller than that in FIG. 5A by one. This is because with an on-count having the same number of bits, as many symbols can be represented as possible.

As another method (not shown), for a symbol string of which the same type of symbols succeed for n (where n≧3)

to the end thereof, only the definition of the on-count for this symbol is changed from the definitions of on-counts of the other symbols. In addition to the definition of the on-count, the bit map of this type of symbols is composed of 1 bit whose value is "1". Thus, the compression ratio in this method can be more improved than that in the method shown in FIG. 5B. In other words, in this method, as the value of an on-count of such a symbol, (n−2) is designated. In a data expanding process (that will be described later) shown in flow charts of FIGS. 11 and 12, data that has been compressed in the above-described method can be expanded as well as the method shown in FIG. 5B.

In the methods shown in FIGS. 3A to 5B, the on-count and the bit map for the last symbol "f" are output. However, when symbols are expanded in the order of bit maps, the bit map of the last symbol is not required. In other words, with only information of the on-count, the last symbol can be placed in a blank position of the symbol string that has been expanded or after the expanded symbol string.

When the last symbol is not present at the end of the symbol string or the number of symbols of such a type is one, an on-count is not required.

Figure 6:
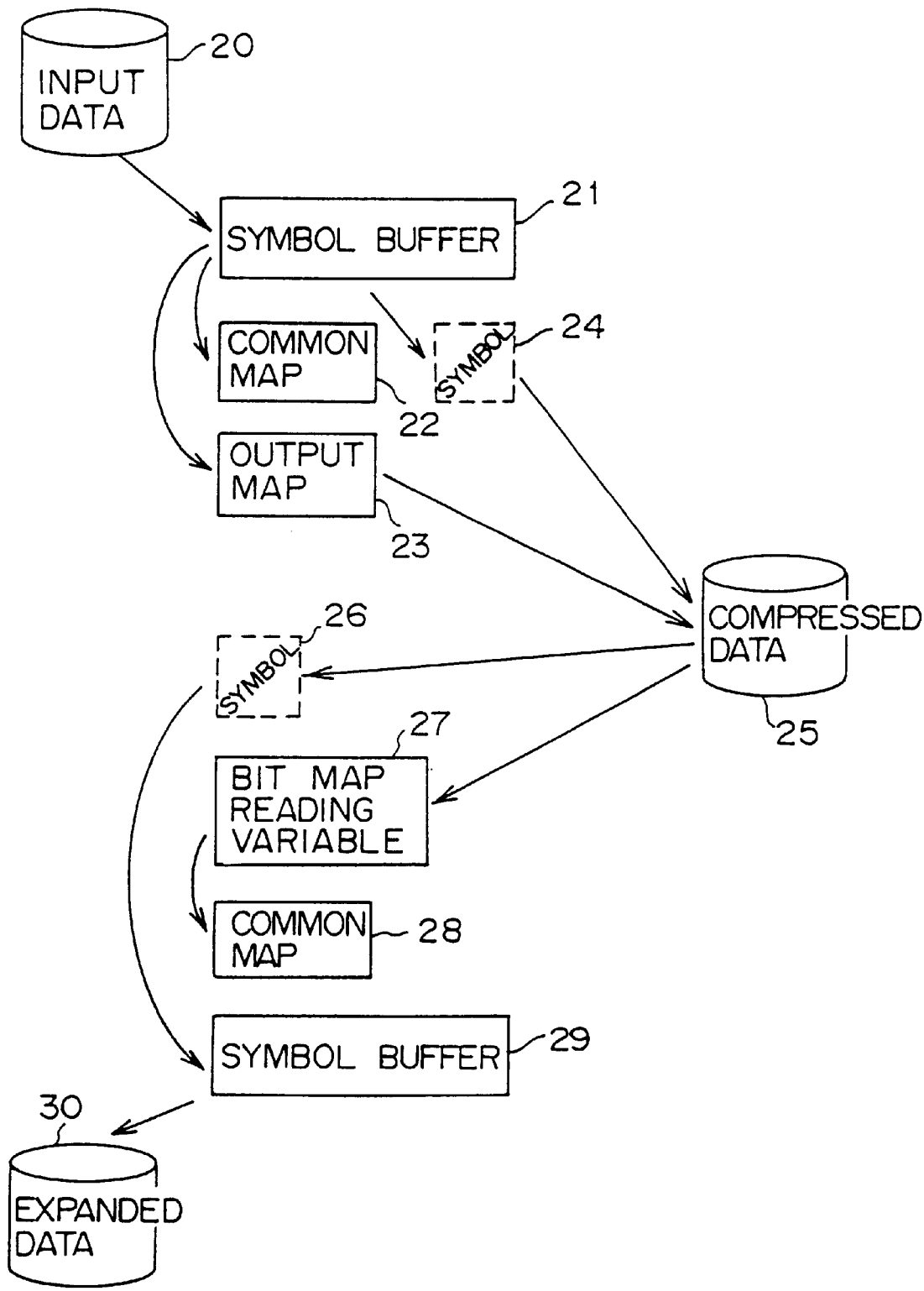
FIG. 6 is a schematic diagram for explaining the concept of data compressing process/data expanding process according to an embodiment of the present invention.

FIG. 6 is a schematic diagram for explaining the concept of the data compressing process/data expanding process according to the embodiment of the present invention.

In the above description, after all pieces of data to be compressed are read, they are processed. In reality, since data to be compressed may be very long, such a manner is not practical. In reality, a symbol buffer 21, a common map 22, and an output map 23 are provided. The symbol buffer 21 reads a predetermined number of bits of input data 20. The common map 22 has the bit length of (the length of the symbol buffer)/(the number of bits that represents each symbol). The symbol buffer 21 is moved as a moving buffer along the input data 20 so as to perform the data compression.

A symbol 24 is extracted from a symbol string that has been read to the symbol buffer 21 and output as compressed data 25. A bit that represents the position of the symbol that has been compressed is recorded in the common map 22. In the output map 23, a bit map that represents the positions of symbols other than those that have been compressed is generated with reference to the common map 22. The bit map of each symbol generated in the output map 23 is output as a bit map of the relevant symbols in the compressed data 25 excluding the first bit with "1" only when the number of bits with "1" is two or more.

When the compressed data 25 is expanded, the symbol 26 is read from the compressed data 25. With reference to the value of a flag (not shown), when a bit map is detected, the bit map is read to a bit map reading variable 27, bit by bit. When the value of each bit of the bit map read to the bit map reading variable 27 is "1", the position of the symbol 28 is registered to the common map 28. After the position of the symbol 26 has been registered to the common map 28, the symbol 26 is placed to the symbol buffer 29 corresponding to the position of the common map 28. With reference to the common map 28, the symbol string in the symbol buffer 29 is successively output from the beginning as expanded data 30.

In the following description, it is assumed that the number of bits that represents each symbol is eight bits.

Figure 7:
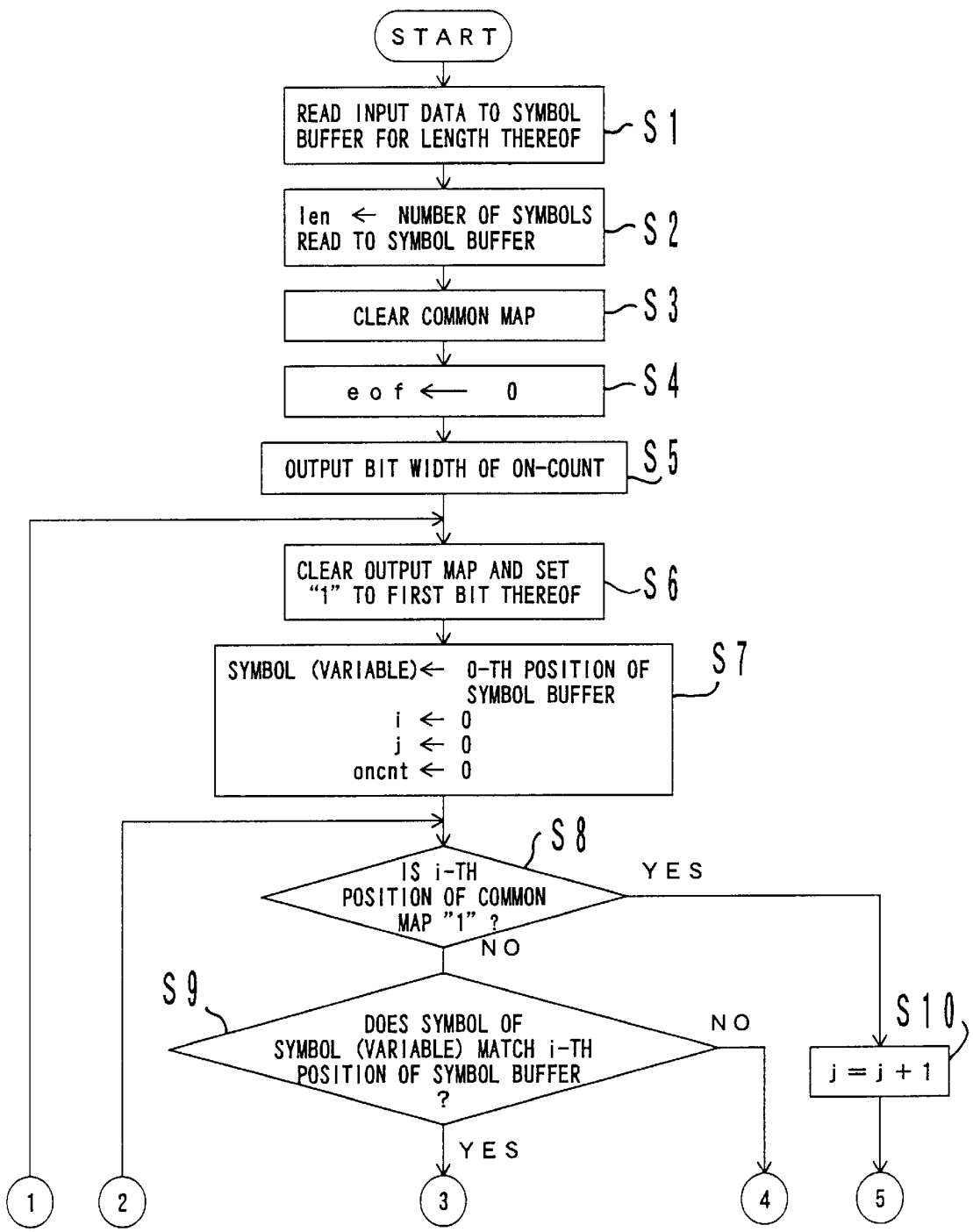
FIG. 7 is a flow chart for explaining the data compressing process (first part) according to the embodiment of the present invention.
Figure 8:
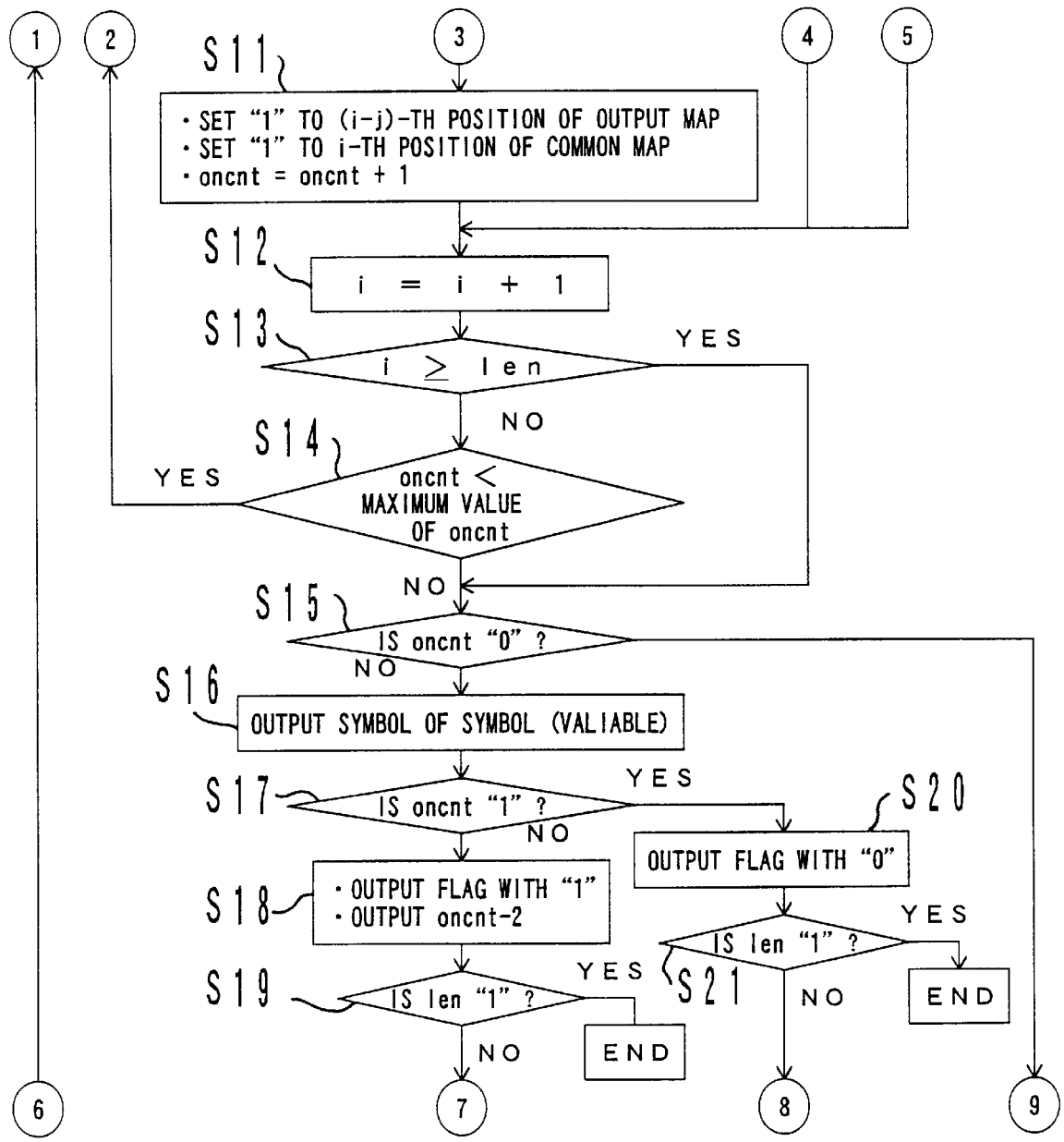
FIG. 8 is a flow chart for explaining the data compressing process (second part) according to the embodiment of the present invention.
Figure 9:
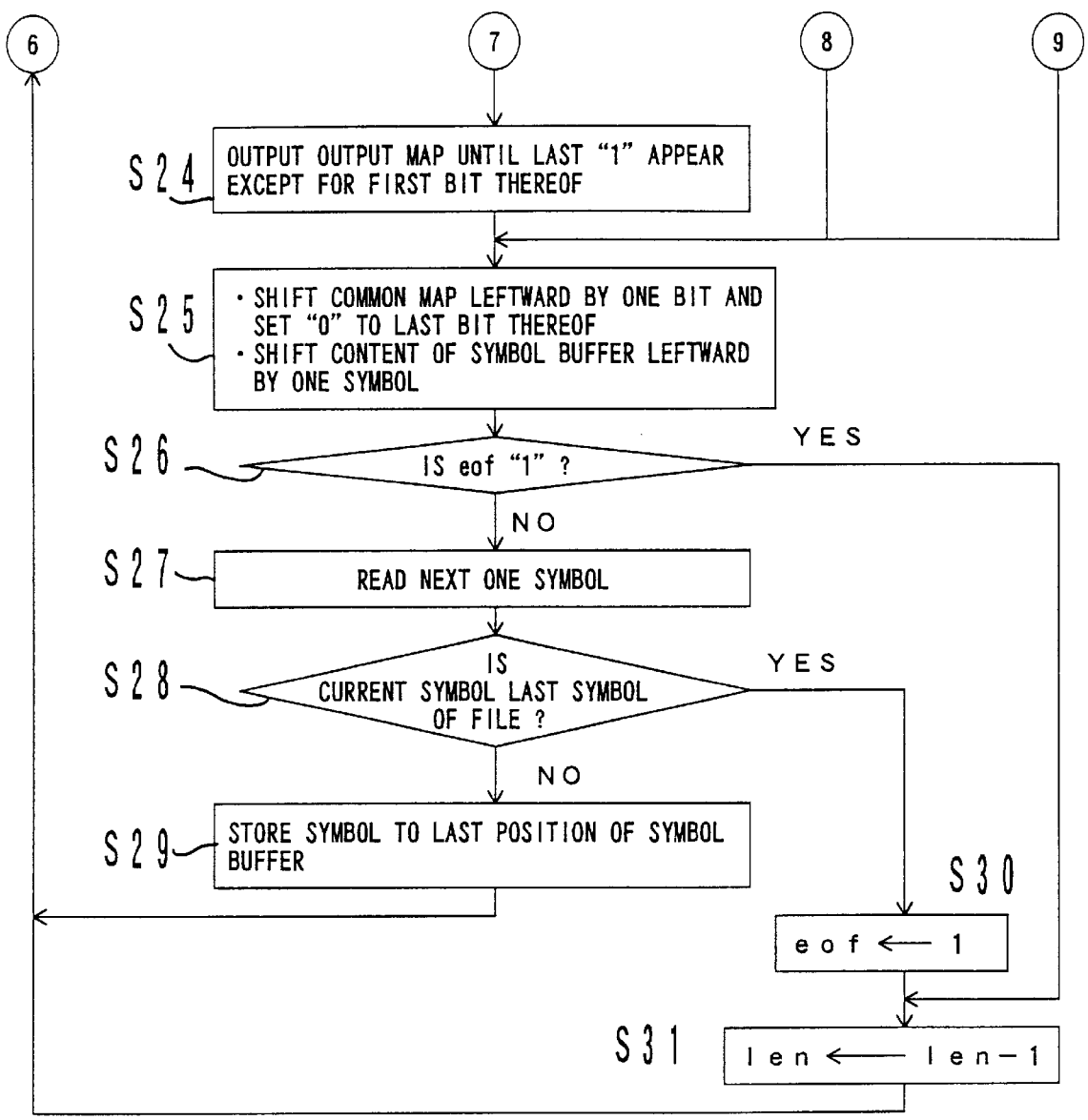
FIG. 9 is a flow chart for explaining the data compressing process (third part) according to the embodiment of the present invention.

FIGS. 7 to 9 are flow charts for explaining the data compressing method according to the embodiment. The data compressing method is accomplished when the CPU 12 executes the data compressing/expanding process program.

Next, the data compressing process shown in FIGS. 7 to 9 will be described with input data shown in FIG. 10.

The data compressing method shown in FIGS. 7 to 9 corresponds to the method shown in FIG. 5B.

At step S1, the input data 20 is read from a data file to be compressed to the symbol buffer 21 for the data length of the symbol buffer 21. At step S2, the number of symbols read to the symbol buffer 21 is set to a variable named len. At step S3, the common map 22 is cleared. At step S4, "0" is set to a variable named eof that represents the end of the data file to be compressed. In other words, the variable eof is initialized. The last position of the data file is obtained corresponding to status information returned by a file management system of the OS on which the data compressing program or a data expanding program (that will be described later) according to the present invention, operates after a data read command is executed for the data file. Thereafter, the bit width of the on-count is output (at step S5).

At step S6, the output map 23 is cleared. "1" is set to the first bit of the output map 23. Next, the 0-th symbol of the symbol buffer 21 is set to a variable that stores a symbol for which a bit map is generated. The variable is referred to as symbol (variable). "0" is set to variables i, j, oncnt (at step S7).

It is assumed that the input data 20 that has been read to the symbol buffer 21 at step S1 is input data 20 "AAABCAD" shown in FIG. 10. At step S8, it is determined whether or not the value of the i-th bit of the common buffer 22 is "1". At step S3, the common map 22 has been cleared. At step S7, "0" has been set to the variable i. Thus, the determined result at step S8 is No (namely, the value of the i-th bit of the common map 22 is not "1"). Consequently, the flow advances to step S9. At step S9, it is determined whether or not the symbol stored in the symbol (variable) matches the i-th symbol of the symbol buffer 21. Since the symbol stored in the symbol (variable) is the 0-th symbol of the symbol buffer 21 and the value of the variable i is "0", the determined result at step S9 is Yes. Thus, the flow advances to step S11 shown in FIG. 8.

At step S11, "1" is set to the (i−j)th bit of the output map 23. "1" is set to the i-th bit of the common map 22. In addition, the value of the variable oncnt is incremented by "1". In this case, "1" is set to the 0-th bit of the output map 23 and the 0-th bit of the common map 22. In this case, the value of the variable oncnt becomes "1". At step S12, the value of the variable i is incremented by "1" (i=2). At step S13, it is determined whether the value of the variable i is equal to or larger than the value of the variable len (namely the last bit of the symbol buffer 21 has been checked out).

In this case, since the determined result at step S13 is No, the flow advances to step S14. At step S14, it is determined whether or not the value of the variable oncnt is smaller than the maximum value of the variable oncnt. The maximum value of the variable oncnt is obtained from the bit width of the on-count that has been output at step S5. Here, the determination as to whether or not when the bit map contains symbols larger than the value of the on-count, the bit map is divided as another character is conducted.

Since the value of the variable oncnt is still "1", the flow returns to step S8. At step S8, it is determined whether or not the value of the i-th bit (Now, i=1) of the common map 22 is "1". Since "1" has been set to only the 0-th bit of the common map 22, the i-th bit thereof is not "1". Thus, at step S9, it is determined whether or not the symbol of the symbol (variable) matches the first symbol of the symbol buffer 21. Since the determined result at step S9 is Yes, the flow advances to step S11. At step S11, "1" is set to the first bit of the output map 23 and the first bit of the common map 22. In addition, the value of the variable oncnt is incremented by "1" (oncnt=2). At step S12, the value of the variable i is incremented by "1" (i=2). At step S13, it is determined whether the value of the variable i is equal to or larger than the value of the variable len (namely, it is determined whether or not all symbols in the symbol buffer 21 have been checked out). Since all the symbols in the symbol buffer 21 have not been checked out, the flow advances to step S14. At step S14, it is determined whether or not the value of the variable oncnt is smaller than the maximum value of the variable oncnt. Since only two symbols have been processed, the flow returns to step S8.

At step S8, it is determined whether or not the value of the i-th bit (i=2) of the common map 22 is "1". However, since the value of the i-th bit of the common map 22 is not "1", the flow advances to step S9. At step S9, it is determined whether or not the content of the symbol (variable) (symbol "A") matches the i-th symbol (i=2) of the symbol buffer 21. Since the third symbol (i=2) in the symbol buffer 21 is also "A", the flow advances to step S11. At step S11, "1" is set to the (i−j)-th bit (second bit) of the output map 23. "1" is set to the i-th bit (i=2) of the common map 22. In addition, the value of the variable oncnt is incremented by "1" (oncnt=3). Thereafter, the flow advances to step S12. At step S12, the value of the variable i is incremented by "1" (i=3). At step S13, it is determined whether the value of the variable i is equal to or larger than the value of the variable len. Since the value of the variable i is smaller than the number of symbols ("7") that have been read to the symbol buffer 21, the flow advances to step S14. At step S14, it is determined whether or not the value of the variable oncnt is smaller than the maximum value (=7) of the variable oncnt. Since the value of the variable oncnt is "3", the flow returns to step S8.

At step S8, it is determined whether or not the value of the i-th bit of the common map 22 is "1". Since the value of the i-th bit of the common map 22 is not "1", the flow advances to step S9. At step S9, it is determined whether or not the symbol ("A") of the symbol (variable) matches the symbol of the i-th (i=3) symbol ("B") of the symbol buffer 21. In this case, since the determined result at step S9 is No, the flow advances to step S12. At step S12, the value of the variable i (i=4) is incremented by "1". At step S13, it is determined whether the value of the variable i (i=4) is equal to or larger than the value of the variable len (len=7). Since the determined result at step S13 is No, the flow advances to step S14. At step S14, it is determined whether or not the value of the variable oncnt (=3) is smaller than the maximum value of the variable oncnt (=7). Since the determined result at step S14 is Yes, the flow returns to step S8.

At step S8, it is determined whether or not the value of the i-th bit (i=4) of the common map 22 is "1". Since the determined result at step S8 is No, the flow advances to step S9. At step S9, it is determined whether or not the symbol ("A") of the symbol (variable) matches the i-th (=4) symbol ("C") of the symbol buffer 21. Since the determined result at step S9 is No, the flow advances to step S12. At step S12, the value of the variable i is incremented by "1" (i=5). At step S13, it is determined whether the value of the variable i is equal to or larger than the value of the variable len (=7). Since the determined result at step S13 is No, the flow advances to step S14. At step S14, it is determined whether or not the value of the variable oncnt is smaller than the maximum value of the variable oncnt. Since the value of the variable oncnt is "3", the determined result at step S14 is Yes. Thus, the flow returns to step S8.

At step S8, it is determined whether or not the value of the i-th bit (i=5) of the common map 22 is "1". Since the determined result at step S8 is No, the flow advances to step S9. At step S9, it is determined whether or not the symbol ("A") of the symbol (variable) matches the i-th (=5) symbol ("A") of the symbol buffer 21. Since the determined result at step S9 is Yes, the flow advances to step S11. At step S11, "1" is set to the (i−j)-th bit (fifth bit) of the output map 23. "1" is set to the i-th bit (i=5) of the common map 22. In addition, the value of the variable oncnt is incremented by "1" (oncnt=4). Thereafter, the flow advances to step S12. At step S12, the value of the variable i is incremented by "1" (i=6). At step S13, it is determined whether the value of the variable i is equal to or larger than the value of the variable len (=7). Since the determined result at step S13 is No, the flow advances to step S14. At step S14, it is determined whether or not the value of the variable oncnt is smaller than the maximum value (=7) of the variable oncnt. Since the determined result at step S14 is No, the flow advances to step S8.

At step S8, it is determined whether or not the value of the i-th bit (i=6) of the common map 22 is "1". Since the determined result at step S8 is No, the flow advances to step S9. At step S9, it is determined whether or not the symbol ("A") of the symbol (variable) matches the i-th symbol ("D") of the symbol buffer 21. Since the determined result at step S9 is No, the flow advances to step S12. At step S12, the value of the variable i is incremented by "1" (i=7). At step S13, it is determined whether the value of the variable i is equal to or larger than the variable len (=7). In this case, since all the symbols in the symbol buffer 21 have been processed, the value of the variable i is equal to or larger than the value of the variable len. Thus, the flow advances to step S15.

At step S15, it is determined whether or not the value of the variable oncnt is "0". In the case of the symbol "A", since the value of the variable oncnt is not "0", the flow advances to step S16. At step S16, the symbol "A" of the symbol (variable) is output. At step S17, it is determined whether or not the value of the variable oncnt is "1". In the case of the symbol "A", since the determined result at step S17 is No, the flow advances to step S18. At step S18, the flag with "1" is output. In addition, the value (oncnt−2) (=2) is output as the value of the on-count (at this point, the contents of the common map 22 and the output map 23 are equal to data of the first symbol "A" shown in FIG. 10).

At step S19, it is determined whether or not the value of the variable len is "1". Since the value of the variable len is "7", the flow advances to step S24. At step S24, the first bit of the output map 23 is removed. The output map 23 is output until the last "1" appears (bit map="11001"). Thus, as shown in FIG. 10, the symbols "A" in the input data "AAABCAD" are compressed to the symbol "A", the flag with "1", the on-count "010", and the bit map "11001". At step S25, the common map 22 is shifted leftward by one bit. "0" is set to the last bit. The content of the symbol buffer 21 is shifted leftward by one symbol. Thereafter, the next symbol is prepared.

At step S26, it is determined whether or not the value of the flag eof is "1". When the determined result at step S26 is No (namely, the value of the flag eof is not "1"), the flow advances to step S27. At step S27, the next symbol of the data file is read. Thereafter, at step S28, it is determined whether or not the symbol read from the data file is the last symbol according to the status information returned by the OS. When the determined result at step S29 is No (namely, the symbol read from the data file is not the last symbol), the flow advances to step S29. At step S29, the symbol read at step S29 is stored to the last position of the symbol buffer 21.

Thereafter, the flow returns to step S6. At step S6, the process is repeated.

Since the input data 20 shown in FIG. 10 is "AAABCAD", at step S28, it is determined whether the last symbol has been read. Since the determined result at step S28 is Yes, the flow advances to step S30. At step S30, "1" is set to the flag eof. At step S31, the value of the variable len is decremented by "1" (len=6).

Next, the flow returns to step S6. To process the input data 20 that has been shifted leftward by one symbol, the output map 23 is cleared. "1" is set to the first bit of the input data 20. At step S7, the 0-th symbol ("A") of the symbol buffer 21 is set to the symbol (variable). In addition, "0" is set to the variables i, j, and oncnt.

At step S8, since the value of the 0-th bit of the common map 22 that has been shift leftward by one bit at step S25 is "1", the flow advances to step S10. At step S10, the value of the variable j is incremented by "1". At step S12, the value of the variable i is incremented by "1" (i=1). At step S13, it is determined whether the value of the variable i (=1) is equal to or larger than the value of the variable len (=6). Since the determined result at step S13 is No, the flow advances to step S14. At step S14, it is determined whether or not the value of the variable oncnt (=0) is smaller than the maximum value of the variable oncnt (=7).

At step S8, it is determined that the value of the i-th bit (i=1) of the common map 22 is "1". Thus, the above-described process is performed. Next, at step S8, it is determined whether or not the i-th bit (i=2) of the common map 22 is "1". Since the determined result at step S8 is No, the flow advances to step S9. At step S9, it is determined whether or not the symbol ("A") of the symbol (variable) matches the i-th (=2) symbol ("B") of the symbol buffer 21. Since the determined result at step S9 is No, the flow advances to step S12. At step S12, the value of the variable i is incremented by "1" (i=3). Thereafter, steps S13 and S14 are performed. By repeating this process, step S11 is skipped for the first symbol "A" of the symbol buffer 21. Thus, at step S15, it is determined whether or not the value of the variable oncnt is "0". Since the determined result at step S15 is Yes, the flow advances to steps S25, S26, and S31. Consequently, the next symbol is processed with no output data (at this point, the contents of the common map 22 and the output map 23 just before step S25 are equal to data of the second symbol (A) shown in FIG. 10).

Since the next symbol is "A", when the same process is performed, no data is output (at this point, the contents of the common map 22 and the output map 23 just before step S25 are equal to data of the third symbol "A" shown in FIG. 10).

At step S25, the symbol "B" of the input data 20 shown in FIG. 10 is present at the first position of the symbol buffer 21. Thus, the content of the common map 22 becomes "0010000". After steps S26, S27, and S31, "4" is set to the variable len. At step S6, the output map 23 is cleared. "1" is set to the first bit of the output map 23. At step S7, "B" is set to the symbol (variable). At step S8, it is determined whether or not the value of the i-th bit (i=0) of the common map 22 is "1". Since the determined result at step S8 is No, the flow advances to step S9. At step S9, it is determined whether or not the symbol "B" of the symbol (variable) matches the i-th (=0) symbol ("B") of the symbol buffer 21. Since the determined result at step S9 is Yes, the flow advances to step S11. At step S11, "1" is set to the (i−j) (0-th) bit of the output map 23. "1" is set to the i-th (=0) bit of the common map 22. "1" is set to the variable oncnt. Thus, the content of the common map 22 becomes "1010000". The content of the output map 23 becomes "1000000". At step S12, the value of the variable i is incremented by "1" (i=1). At step S13, it is determined whether the value of the variable i (=1) is equal to or larger than the value of the variable len (=4). Since the determined result at step S13 is No, the flow advances to step S14. At step S14, it is determined whether or not the value of the variable oncnt is smaller than the maximum value of the variable oncnt. Since the determined result at step S14 is Yes, the flow returns to step S8.

At step S8, it is determined whether or not the value of the i-th bit (i=1) of the common map 22 is "1". Since the determined result at step S8 is No, the flow advances to step S9. At step S9, it is determined whether or not the symbol ("B") of the symbol (variable) matches the i-th (i=1) symbol ("C") of the symbol buffer 21. Since the determined result at step S9 is No, the flow advances to step S12. At step S12, the value of the variable i is incremented by "1" (i=2). At step S13, it is determined whether the value of the variable i is equal to or larger than the value of the variable len (=4). Since the determined result at step S13 is No, it is determined whether or not the value of the variable oncnt (=1) is smaller than the maximum value of the variable oncnt. Since the determined result at step S13 is Yes, the flow returns to step S8.

At step S8, it is determined whether or not "1" has been set to the i-th bit (i=2) of the common map 22. Since the i-th symbol (i=2) of the symbol buffer 21 is "A", the determined result at step S22 is Yes. Thus, the flow advances to step S10. At step S10, the value of the variable j is incremented by "1" (j=1). At step S12, the value of the variable i is incremented by "1" (i=3). At step S13, it is determined whether the value of the variable i (=3) is equal to or larger than the value of the variable len (=4). Since the determined result at step S13 is No, the flow advances to step S14. At step S14, it is determined whether or not the value of the variable oncnt (=1) is smaller than the maximum value of the variable oncnt (=7). Since the determined result at step S14 is Yes, the flow returns to step S8.

Since "1" has been set to the i-th (=3) bit of the common map 22, the determined result at step S8 is No. Thus, the flow advances to step S9. At step S9, it is determined whether or not the symbol "B" of the symbol (variable) matches the i-th (=3) symbol ("D") of the symbol buffer 21. Since the determined result at step S9 is No, the flow advances to step S12. At step S12, the value of the variable i is incremented by "1" (i=4). At step S13, it is determined whether the value of the variable i is equal to or larger than the value of the variable len (=4). Since the determined result at step S13 is Yes, the flow advances to step S15. At step S15, it is determined whether or not the value of the variable oncnt is "0". Since there is one symbol "B" in the input data 20 shown in FIG. 10, as described above, step S11 is performed for the symbol "B" once. Thus, since the value of the variable oncnt is "1", the determined result at step S15 is No. Consequently, at step S16, the symbol "B" is output.

Next, at step S17, it is determined whether or not the value of the variable oncnt is "1". Since the determined result at step S17 is Yes, the flow advances to step S20. At step S20, the flag with "0" is output. At step S21, it is determined whether or not the current symbol is the last symbol of the data file (namely, the value of the variable len is "1"). Since the symbol "B" is not the last symbol (len=4), steps S25, S26, and S31 are performed. Thereafter, the flow returns to step S6. At step S6, the next symbol is processed (at this point, the contents of the common map 22 and output map 23 just before the step S25 are equal to data of the fourth symbol "B" shown in FIG. 10). At step S25, the content of the common map 22 becomes "0100000". The first symbol of the symbol buffer 21 becomes "C".

Thus, in the case of the input data shown in FIG. 10, for the symbol "B", the symbol "B" and the flag with "0" are output.

At step S6, the output map 23 is cleared. "1" is set to the first bit of the output map 23. At step S7, the 0-th symbol ("C") of the symbol buffer 21 is set to the symbol (variable). "0" is set to the variables i, j, and oncnt. In the case of the symbol "C", at step S30, the value of the variable len is "3". As with the symbol "B", "1" is set to the i-th (=0) bit of the common map 22 (at this point, the contents of the common map 22 and the output map 23 are equal to data of the fifth symbol "C" shown in FIG. 10). Next, the flow returns to step S6. At step S6, the next symbol is processed. Thus, at step S16, the symbol "C" is output. At step S20, the flag with "0" is output. Thus, in the case of the input data 20 shown in FIG. 20, as with the symbol "B", for the symbol "C", only the symbol "C" and the flag with "0" are output.

At step S6, the output map 23 is cleared. "1" is set to the first bit of the output map 23. At step S7, the 0-th symbol ("A") of the symbol buffer 21 is set to the symbol (variable). "0" is set to the variables i, j, and oncnt.

In the case of the symbol "A", the bit map has been generated as described above. At step S25 that precedes step S6, "1000000" has been set to the output map 23. At step S31, "2" is set to the variable len. Since "1" has been set to the i-th (=0) bit of the common map 22, the determined result at step S8 is Yes. At step S12, the value of the variable i is incremented by "1" (i=1). At step S13, it is determined whether the value of the variable i (=1) is equal to or larger than the value of the variable len (=2). Since the determined result at step S13 is No, the flow advances to step S14. At step S14, it is determined whether or not the value of the variable oncnt (=0) is smaller than the maximum value of the variable oncnt. Since the determined result at step S14 is Yes, the flow returns to step S8. At step S8, it is determined whether or not the value of the variable i is "1". Since the determined result at step S8 is No, the flow advances to step S9. At step S9, it is determined whether or not the symbol "A" of the symbol (variable) matches the i-th (i=1) symbol "D" of the symbol buffer 21. Since the determined result at step S9 is No, the flow advances to step S12. At step S12, the value of the variable i is incremented by "1" (i=2). At step S13, it is determined whether the value of the variable i is equal to or larger than the value of the variable len (=2). Since the determined result at step S13 is Yes (namely, the symbol ("A") has been determined in the symbol buffer 21), the flow advances to step S15. Since the value of the variable oncnt is still "0", the determined result at step S15 is Yes. Next, steps S25, S26, and S31 are performed with no output data. Thereafter, the flow advances to step S6. At step S6, the next symbol "D" is processed (the contents of the common map 22 and the output map 23 just before step S25 are equal to data of the sixth symbol "A" shown in FIG. 10).

At step S6, the output map 23 is cleared. "1" is set to the first bit of the output map 23. At step S7, the 0-th symbol "D" of the symbol buffer 21 is set to the symbol (variable). "0" is set to the variables i, j, and oncnt. At step S8, it is determined whether or not the value of the i-th bit (i=0) of the common map 22 is "1". At this point, since the content of the common map 22 is "0000000", the determined result at step S8 is No. Thus, the flow advances to step S9. At step S9, it is determined whether or not the symbol ("D") of the symbol (variable) matches the i-th (i=0) symbol "D" of the symbol buffer 21. Since the determined result at step S9 is Yes, the flow advances to step S11. At step S11, "1" is set to the (i–j) bit (0-th bit) of the output map 23. "1" is set to the i-th bit (i=0) of the common map 22. At step S12, the value of the variable i is incremented by "1" (i=1). Thereafter, the flow advances to step S13. In this case, since the current symbol is the last symbol of the input data 20, the value of the variable len is "1". In addition, the value of the variable i is "1". Thus, the flow advances to step S15. Next, steps S16, S17, S20, and S21 are performed (at this point, the contents of the common map 22 and the output map 23 are equal to data of the seventh symbol "D" shown in FIG. 10). Thus, at step S16, the symbol "D" is output. At step S20, the flag with "0" is output. Since the value of the variable len is "1", the determined result at step S21 is Yes. Thus, the data compressing process of the input data 20 is completed.

Even if the value of the variable oncnt is not "1" as the determined result at step S17, when the value of the variable len is "1" as the determined result at step S19, the data compressing process of the input data 20 is completed.

FIG. 10 shows the final results of the common map 22, the output map 23, and the compressed data 25 for the first to seventh symbols of the input data 20. The common map 22 stores the positions of each symbol in the input data 20. A bit map as compressed data is generated in the output map 23. Corresponding to the value of the variable oncnt, {symbol, flag, on-count, bit map} (in the case of oncnt≧2) or {symbol, flag} (in the case of oncnt=1) is output. Thus, the input data 20 composed of a symbol string can be compressed. In FIG. 10, as the process advances, the common map 22 is shifted leftward. In addition, "1" is set to a bit corresponding to the position of a symbol that has been processed in the symbol buffer 21. The output map 23 is a work buffer that generates a bit map of each symbol. To omit bits to which "1" has been set in the common map 22, the common map 22 is referenced. In other words, "1" has been set to the bits of the second and third symbols "A". Thus, the bit maps of the second and third symbols have not been generated in the output map 23 (all bits are "0").

In the example of the compressed data shown in FIG. 10, although data that represents the number of bits (bit width) of an on-count is not included, actually, three-bit data representing the bit width is output at the beginning of the compressed data 25.

Figure 11:
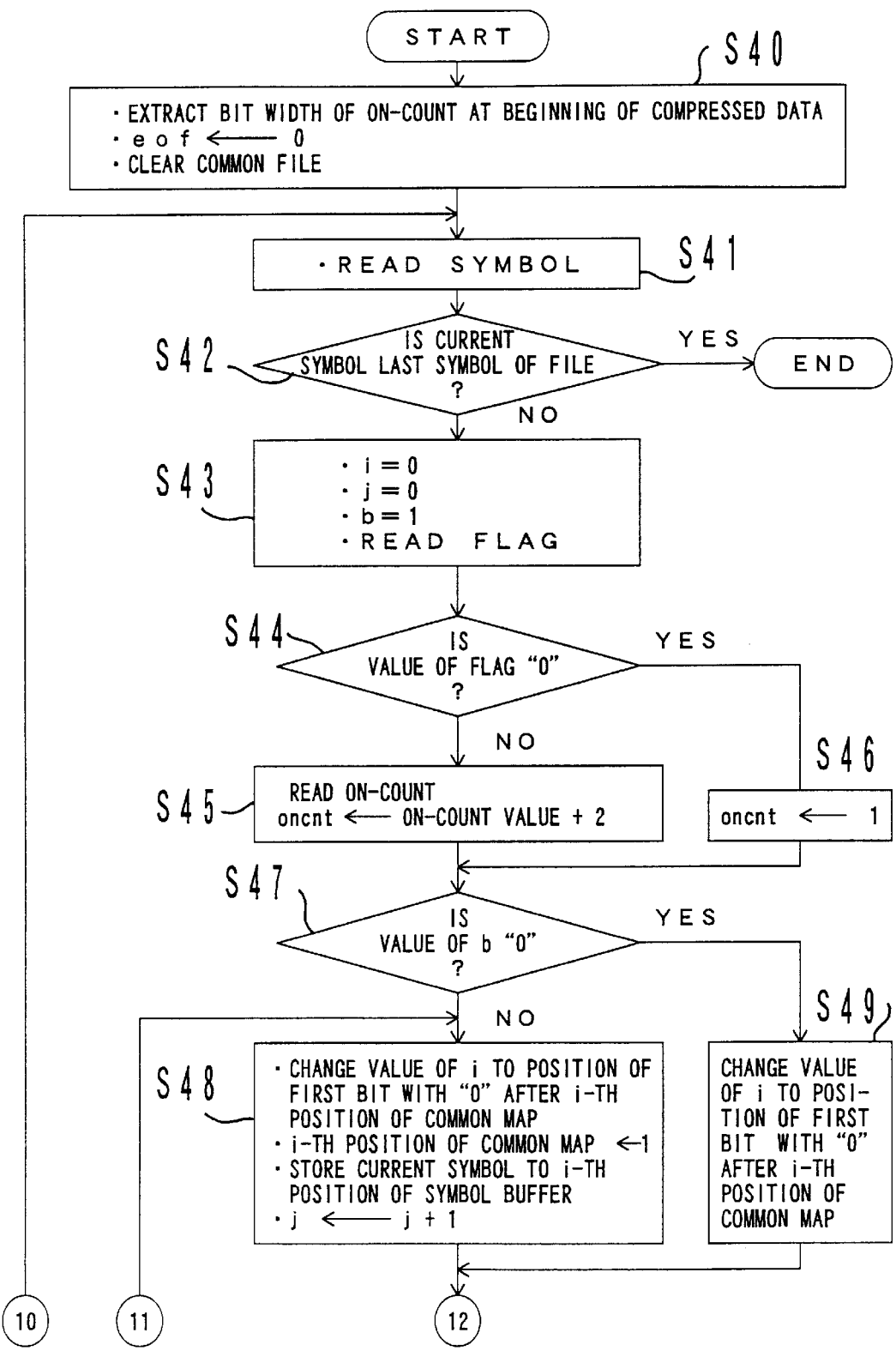
FIG. 11 is a flow chart for explaining a data expanding process (first part) according to the embodiment of the present invention.
Figure 12:
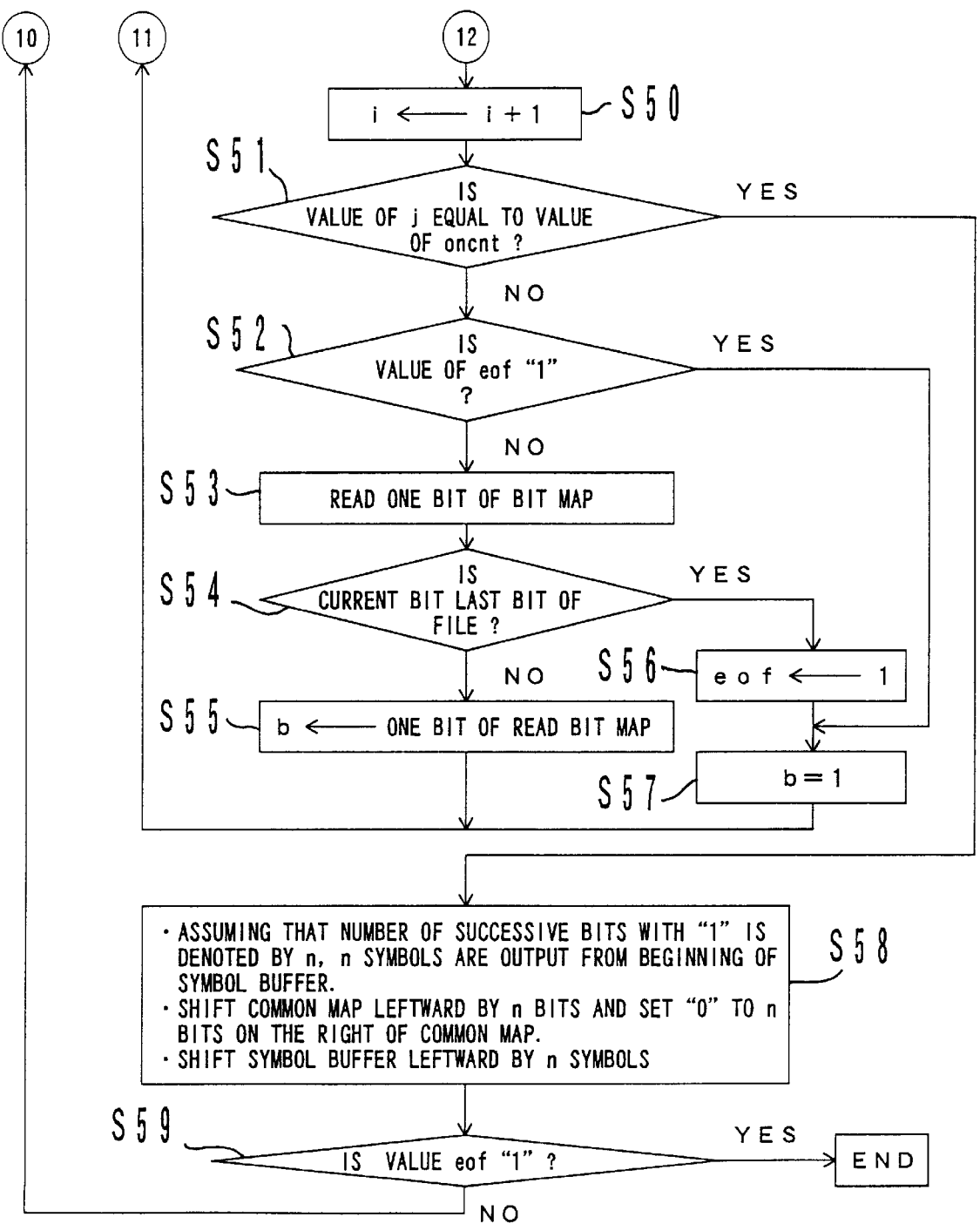
FIG. 12 is a flow chart for explaining a data expanding process (second part) according to the embodiment of the present invention.

FIGS. 11 and 12 are flow charts of a data expanding process for expanding data compressed by the data compressing process shown in the flow charts of FIGS. 7 to 9.

FIG. 13 is a schematic diagram showing a common map 28 and so forth used to expand the compressed data 25 of the input data 20 shown in FIG. 10. Next, with reference to the flow charts of FIGS. 11 and 12, the data expanding process according to the present invention will be described. In the example of the compressed data 25 shown in FIG. 13, data that represents the bit width of an on-count is omitted. In reality, data that represents that the bit width of an on-count is 3 bits is present at the beginning of the compressed data 25.

When the data expanding process is started up, the flow advances to step S40. At step S40, the bit width (3 bits) of an on-count at the beginning of the compressed data 25 is extracted from the file of the compressed data 25. "0" is set to a flag eof. A common map 28 is cleared. At step S41, a symbol (first symbol) of the compressed data 25 is read from the file of the compressed data 25. At step S42, it is determined whether or not the current symbol is the last symbol of the compressed data file. Since the determined result at step S42 is No (namely, the current symbol is not the last data of the compressed data file), the flow advances to step S43. At step S43, "1" is set to variables i and j. "1" is set to a variable b. Next, a flag that follows the symbol is read. In this case, the variable i represents the bit position of the common map 28. The variable j is a counter that counts the number of symbols that are output. The variable b represents the value of each bit of the bit map in the compressed data 25.

The reason why "1" is set to the variable b is in that the first bit with "1" of the original bit map has been deleted in the bit map of the compressed data 25. The symbol corresponding to the first bit with "1" that has been deleted is expanded at step S48 (that will be described later). At step S53 (that will be described later), the bit map of each symbol of the compressed data 25 is read from the beginning, bit by bit. Thus, each symbol is expanded for the number of symbols equal to the value of the variable oncnt that is set at step S45 (that will be described later).

At step S44, it is determined whether or not the value of the flag is "0" (namely, the symbol is followed by an on-count and a bit map). When the determined result at step S44 is Yes (namely, the value of the flag is "0"), the flow advances to step S46. At step S46, "1" is set to the variable oncnt. When the determined result at step S44 is No, the flow advances to step S45. At step S45, (on-count value+2) is set to the variable oncnt. In the case of the symbol "A", since the three-bit on-count value that follows the symbol "A" and the flag is "010", the value of the variable oncnt is "4".

At step S47, it is determined whether or not the value of the variable b is "0". In this case, since the value of the variable b is "1" at step S43, the determined result at step S47 is No. At step S48, the value of the variable i is changed to the position of the first bit with "0" after the i-th bit (i=0) of the common map 28. Since the common map 28 has just been cleared, "0" is set to the variable i (see the upper common map 28 "0000000" of the first symbol "A" shown in FIG. 13). "1" is set to the i-th bit (i=0) of the common map 28. The symbol that has been read at step S41 is stored in the i-th symbol of the symbol buffer 29. Thereafter, the value of the variable j is incremented by "1". Thus, the symbol "A" is stored to the 0-th position of the symbol buffer 29.

Next, at step S50, the value of the variable i is incremented by "1" (i=1). At step S51, it is determined whether or not the value of the variable j (=1) is equal to the value of the variable oncnt (=4). Since the value of the variable oncnt for the symbol "A" of the compressed data 25 shown in FIG. 13 is "4", the determined result at step S51 is No. At step S52, it is determined whether or not the value of the variable eof is "1". Since the value of the variable eof is "0", the determined result at step S52 is No.

At step S53, one bit of the bit map is read from the compressed data file. At step S54, it is determined whether or not the current bit is the last bit of the compressed data file according to the status information returned by the OS. When the current bit is not the last data of the compressed data file, the value of the bit of the bit map is set to the variable b. At this point, since the bit of the bit map is the first bit of the bit map for the symbol "A" shown in FIG. 13, the value of the bit is "1".

Thereafter, the flow returns to step S47. At step S47, it is determined whether or not the value of the variable b is "0". In the case of the symbol "A", since there are two successive bits with "1", the value of the variable b is not "0". Thus, at step S48, the value of the variable i is changed to the position of the first bit with "0" after the i-th bit (i=1) of the common map 28. In this case, the value of the variable i is still "1". Next, "1" is set to the i-th bit (i=1) of the common map 28. The symbol "A" is stored to the i-th position of the symbol buffer 29. The value of the variable j is incremented by "1" (j=2). Thereafter, the flow advances to step S50. At step S50, the value of the variable i is incremented by "1" (i=2). At step S51, it is determined whether or not the value of the variable j (=2) is equal to the value of the variable oncnt (=4). Since the determined result at step S51 is No, the flow advances to step S52. At step S52, it is determined whether or not the value of the variable eof is "1". Since the determined result at step S52 is No, the flow advances to step S53. At step S53, the next one bit is read from the bit map. At step S54, it is determined whether or not the current bit is the last bit of the compressed data file according to the status information returned by the OS. Since the determined result at step S54 is No, the bit read at step S55 is set to the variable b. Thereafter, the flow returns to step S47. At this point, since the bit read at step S53 is the second bit of the bit map of the symbol "A" shown in FIG. 13, the value of the bit is "1".

Next, at step S47, it is determined whether or not the value of the variable b is "0". Since the value of the variable b is "1", the determined result at step S47 is No. At step S48, the value of the variable i (=2) is changed to the position of the first bit with "0" after the i-th bit (i=2) of the common map 28. "1" is set to the i-th bit (i=2) of the common map 28. The symbol "A" is stored to the i-th position (i=2) of the symbol buffer 29. The value of the variable j is incremented by "1" (j=3). At step S50, the value of the variable i is incremented by "1" (i=3). At step S51, it is determined whether or not the value of the variable j (=3) is equal to the value of the variable oncnt (=4). Since the determined result at step S51 is No, the flow advances to step S52. At step S52, it is determined whether or not the value of the variable eof is "1". Since the determined result at step S52 is No (namely, the value of the variable eof is not "1"), the flow advances to step S53. At step S53, the next bit of the bit map is read from the compressed data file. At step S54, it is determined whether or not the current bit is the last bit of the compressed data file according to the status information returned by the OS. Since the determined result at step S54 is No (namely, the current bit is not the last data of the compressed data file), the flow advances to step S55. At step S55, the bit of the bit map is set to the variable b. At this point, since the third bit of the bit map for the symbol "A" shown in FIG. 13 is read, "0" is set to the variable b. Next, the flow returns to step S47.

At step S47, it is determined whether or not the value of the variable b is "0". Since the determined result at step S47 is Yes (namely, the value of the variable b is "0"), the flow advances to step S49. At step S49, the value of the variable i is changed to the position of the first bit with "0" after the i-th bit (i=3) of the common map 28. At step S51, the value of the variable i is incremented by "1" (i=4). It is determined whether or not the value of the variable j (=3) is equal to the value of the variable oncnt (=4) (at step S49). Since the determined result at step S49 is No (namely, the value of the variable j is not equal to the value of the variable oncnt), the flow advances to step S52. At step S52, it is determined whether or not the value of the variable eof is "1". Since the determined result at step S52 is No (namely, the value of the variable eof is "0"), the flow advances to step S53. At step S53, the next bit of the bit map (the fourth bit of the bit map for the symbol "A" shown in FIG. 13) is read from the compressed data file. At step S54, it is determined whether or not the current bit is the last bit of the compressed data file according to the status information returned by the OS. Since the determined result at step S54 is No (namely, the current bit is not the last data of the compressed data file), the flow advances to step S55. At step S55, the bit ("0") read at step S53 is set to the variable b. Thereafter, the flow returns to step S47.

Since the value of the variable b is "0" as the determined result at step S47, the flow advances to step S49. At step S49, the value of the variable i (i=4) is changed to the position of the first bit with "0" (the fourth position) after the i-th bit (i=4) of the common map 28. At step S50, the value of the variable i is incremented by "1" (i=5). At step S51, it is determined whether or not the value of the variable j (=3) is equal to the value of the variable oncnt (=4). Since the determined result at step S51 is No, the flow advances to step S52. At step S52, it is determined whether or not the value of the variable eof is equal to "1". Since the determined result at step S52 is No, the next bit of the bit map is read from the compressed data file. In FIG. 13, the fifth bit of the bit map for the symbol "A" is read. At step S54, it is determined whether or not the data read at step S53 is the last bit of the compressed data file. Since the determined result at step S54 is No (namely, the data read at step S53 is not the last bit of the compressed data file), the flow advances to step S55. At step S55, the bit read at step S53 is set to the variable b (b=1). Thereafter, the flow returns to step S47.

Since the determined result at step S47 is No (namely, the value of the variable b is not "0"), the flow advances to step S48. At step S48, the value of the variable i (=5) is changed to the position of the first bit with "0" after the i-th (=5) bit of the common map 28. "1" is set to the i-th (=5) bit of the common map 28. In addition, the symbol "A" is stored to the i-th (=5) bit of the common map 28. The value of the variable j is incremented by "1" (j=4). At step S50, the value of the variable i is incremented by "1" (i=6). At step S51, it is determined whether or not the value of the variable j (=4) is equal to the value of the variable oncnt (=4). In this case, since the determined result at step S51 is Yes (namely, the value of the variable j is equal to the value of the variable oncnt), the flow advances to step S58. At step S58, assuming that the number of successive bits with "1" is denoted by n (n=3), n (=3) symbols ("A") are output from the symbol buffer 29 (see the middle common map 28 "1110010" of the first symbol "A" shown in FIG. 13). The common map 28 is shifted leftward by n bits (n=3). "0" is set to n bits on the right (see the lower common map 28 "0010000" of the first symbol shown in FIG. 13). Next, the symbol buffer 29 is shifted leftward by n symbols (n=3). At step S59, it is determined whether or not the value of the variable eof is "1". Since the determined result at step S59 is No (namely, the value of the variable eof is not "1"), the flow returns to step S41.

At step S41, the next symbol is read from the compressed data file (the symbol "B" of the compressed data 25 shown in FIG. 13). At step S42, it is determined whether or not the symbol read at step S41 is the last symbol of the compressed data file according to the status information returned by the OS. Since the determined result at step S42 is No (namely, the symbol read at step S41 is not the last data of the compressed data file), the flow advances to step S43. At step S43, "0" is set to the variables i and j. "1" is set to the variable b. The flag is read from the compressed data file. At step S44, it is determined whether or not the value of the flag is "0". Since the determined result at step S44 is Yes, the flow advances to step S46. At step S46, "1" is set to the variable oncnt. At step S47, it is determined whether or not the value of the variable b is "0". Since "1" has been set to the variable b at step S43, the determined result at step S47 is No. Thus, the flow advances to step S48. At step S48, the value of the variable i is changed to the position of the first bit with "0" after the i-th bit (i=0) of the common map 28. Since the common map 28 has been shifted by n bits (n=3) at step S58, the position of the first bit with "0" after the i-th (i=0) bit is the 0-th bit (namely, the value of the variable i is "0") (see the upper common map 28 "0010000" of the second symbol (B) shown in FIG. 13). "1" is set to the i-th (i=0) bit of the common map 28 (see the middle common map 28 "1010000" of the second symbol shown in FIG. 13). The symbol ("B") is stored to the i-th (i=0) position of the symbol buffer 29. The value of the variable j is incremented by "1" (j=1). At step S50, the value of the variable i is incremented by "1" (i=1). At step S51, it is determined whether or not the value of the variable j (=1) is equal to the value of the variable oncnt (=1). Since the determined result at step S51 is Yes (namely, the value of the variable j is equal to the value of the variable oncnt), the flow advances to step S58. Assuming that the number of successive bits with "1" is denoted by n (=1), n (=1) symbols ("B") are output from the beginning of the symbol buffer 29. The common map 28 is shifted leftward by n (=1) bits. "0" is set to the n (=1) bits on the right of the common map 28 (see the lower common map 28 "0100000" of the second symbol shown in FIG. 13). In addition, the symbol buffer 29 is shifted leftward by n (=1) symbols. Thereafter, the flow advances to step S59. At step S59, it is determined whether or not the value of the variable eof is "1". Since the determined result at step S59 is No (namely, the value of the variable eof is not "1"), the flow returns to step S41.

At step S41, the next symbol "C" of the compressed data 25 shown in FIG. 13 is read from the compressed data file. At step S42, it is determined whether or not the symbol read at step S41 is the last symbol of the compressed data file according to the status information returned by the OS. Since the determined result at step S42 is No (namely, the symbol read at step S41 is not the last data of the compressed data file), the flow advances to step S43. At step S43, "0" is set to the variables i and j. "1" is set to the variable b. The next flag is read from the compressed data file. As shown in FIG. 13, the value of the flag is "0". At step S44, it is determined whether or not the value of the flag is "0". Since the determined result at step S44 is Yes, the flow advances to step S46. At step S46, "1" is set to the variable oncnt. At step S47, it is determined whether or not the value of the variable b is "0". Since the determined result at step S47 is No (namely, the value of the variable b is "1"), the flow advances to step S48. At step S48, the value of the variable i is changed to the position of the first bit with "0" after the i-th (i=0) bit of the common map 28 (see the upper common map 28 "0100000" of the third symbol "C" of FIG. 13). "1" is set to the i-th (i=0) bit of the common map 28 (see the middle common map 28 "1100000" of the third symbol of FIG. 13). The symbol ("C") read at step S41 is stored to the i-th (i=0) position of the symbol buffer 29. Thereafter, the value of the variable j is incremented by "1" (j=1). At step S50, the value of the variable i is incremented by "1" (i=1). At step S51, it is determined whether or not the value of the variable j (=1) is equal to the value of the variable oncnt (=1). Since the determined result at step S51 is Yes (namely, the value of the variable j is equal to the value of the variable oncnt), the flow advances to step S58. Assuming that the number of successive bits with "1" is denoted by n, at step S58, n symbols are output from the beginning of the symbol buffer 29. In this case, as shown in the middle common map 28 of the third symbol of FIG. 13, two bits with "1" succeed. These two bits represent that the symbol "C" and the first symbol "A" are successively stored in the symbol buffer 29. Thus, the value of the variable n is "2". Two symbols ("C" and "A") are output from the beginning of the symbol buffer 29 (see the middle common map 28 "1100000" of the third symbol in FIG. 13). The common map 28 is shifted leftward by n (=2) bits. "0" is set to the n bits (=2) on the right of the common map 28 (see the lower common map 28 "0000000" of the third symbol in FIG. 13). In addition, the symbol buffer 29 is shifted leftward by n (=2) symbols. Thereafter, the flow advances to step S59. At step S59, it is determined whether or not the value of the variable eof is "1". Since the determined result at step S59 is No (namely, the value of the variable eof is "0"), the flow returns to step S41.

At step S41, the next symbol ("D" in FIG. 13) is read from the compressed data file. At step S42, it is determined whether or not the current symbol is the last symbol of the compressed data file according to the status information returned by the OS. Since the determined result at step S42 is No (namely, the symbol read at step S41 is not the last data of the compressed data file), the flow advances to step S43. At step S43, "0" is set to the variables i and j. "1" is set to the variable b. The flag is read from the compressed data file (the value of the flag is "0" in the case of the symbol "D" in FIG. 13). At step S44, it is determined whether or not the value of the flag is "0". Since the determined result at step S44 is Yes (namely, the value of the flag is "0"), the flow advances to step S46. At step S46, "1" is set to the variable oncnt. At step S47, it is determined whether or not the value of the variable b is "0". Since the determined result at step S47 is No (namely, the value of the variable b is "1"), the flow advances to step S48. At step S48, the value of the variable i is changed to the position of the first bit with "0" after the i-th (i=0) bit of the common map 28 (see the upper common map 28 "0000000" of the fourth symbol "D" of FIG. 13). "1" is set to the i-th (i=0) bit of the common map 28 (see the lower common map 28 "1000000" of the fourth symbol of FIG. 13). The symbol ("D") read at step S41 is stored to the i-th (=0) position of the symbol buffer 29. In addition, the value of the variable j is incremented by "1" (j=1). At step S50, the value of the variable i is incremented by "1" (i=1). At step S51, it is determined whether or not the value of the variable j (=1) is equal to the value of the variable oncnt (=1). Since the determined result at step S51 is Yes, the flow advances to step S58. Assuming that the number of successive bits with "1" is denoted by n (see the lower common map 28 "1000000" of the fourth symbol of FIG. 13), at step S58, n (=1) symbols ("D") are output from the beginning of the symbol buffer 29. The common map 28 is shifted leftward by n (=1) bits. "0" is set to the n (=1) bits on the right of the common map 28. In addition, the symbol buffer 29 is shifted leftward by n (=1) symbols. In FIG. 13, one symbol "D" is output corresponding to the lower common map 28 of the fourth symbol. Next, the flow advances to step S59. At step S59, it is determined whether or not the value of the variable eof is "1". Since the determined result at step S59 is No (namely, the value of the variable eof is not "1"), the flow returns to step S41.

At step S41, the next symbol is read from the compressed data file. However, since there is no data in the compressed data file, at step S42, it is determined that the compressed data file does not have any data. Thus, the process is completed.

In the case shown in FIG. 13, the last symbol of the compressed data 25 does not have a bit map. However, when the last symbol has a bit map, at step S54, it is determined whether or not there is data in the compressed data 25 according to the status information returned by the OS. When the determined result at step S54 is Yes, the flow advances to step S56. At step S56, "1" is set to the variable eof. In addition, at step S57, "1" is set to the variable b. Thus, the bit with "1" that has been deleted from the original bit map (see FIG. 4) for improving the compression ratio in the data compressing method in FIG. 5B is restored. Next, steps S47, S48, S50, S51, and S58 are performed. At step S59, the process is completed.

In FIG. 13, the upper, middle, and lower common maps 28 corresponding to the first symbol, the second symbol, and the third symbol represent the state before step S48, the state before step S58, and the state after step S48, respectively. The upper and lower common maps 28 corresponding to the fourth symbol "D" represent the state before step S48 and the state after step S48, respectively, With the common map 28 that is a work buffer for recording the positions of symbols that have been placed, symbols are placed to positions corresponding to bits with "0" in the common map 28 of the symbol buffer 29. Thus, data that has been compressed in a bit map format can be expanded.

According to the present invention, a data compressing method that is effective even if the amount of data is small can be provided.

According to the data expanding method of the present invention, a data file can be effectively compressed regardless of the amount of data. Thus, the record region of a storage medium can be effectively used.

In addition, when a data communication is performed, since data can be effectively compressed and then sent/received, the communication cost can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A data compressing method, comprising the steps of:
   (a) reading data to be compressed;
   (b) extracting symbols from the read data;
   (c) generating bit maps that represent positions of the extracted symbols in the read data;
   (d) deleting bits that represent that the extracted relevant symbols are not present from the last bit that represents the presence of the extracted relevant symbol to the end of the relevant bit map;
   (e) calculating a counter value that represents the bit length of a new bit map obtained at the step (e); and
   (f) combining the extracted symbol, the bit map generated at the step (e), and the count value and outputting the resultant data as compressed data,
      wherein each of the bit maps generated at the step (c) represents the positions of the extracted relevant symbols in the order of the occurrence of the data that has been read.

2. The data compressing method as set forth in claim 1, wherein each symbol is extracted from the read data in the order of the occurrence, and wherein the steps (c), (e), (f), and (d) are successively executed as a compressing process for each symbol so as to compress the data that has been read.

3. The data compressing method as set forth in claim 2, further comprising the step of:
   (g) deleting the positions of symbols that have been compressed in the read data from the relevant bit map for each symbol to be compressed,
      wherein the step (g) is performed between the steps (e) and (f).

4. The data compressing method as set forth in claim 3, further comprising the step of:
   (h) deleting a bit that is placed at the beginning of each bit map and that represents the presence of the relevant symbols corresponding to the bit map,
      wherein the step (h) is performed between the steps (g) and (f).

5. The data compressing method as set forth in claim 4, wherein when the same type of symbols that have been extracted are present in different positions of the read data, these symbols are separately compressed.

6. The data compressing method as set forth in claim 5, further comprising the step of:
   (i) combining a flag that represents whether or not the counter value of a particular symbol and a bit map thereof have been recorded as compressed data with the particular symbol and outputting the resultant data as composed data.

7. The data compressing method as set forth in claim 1, wherein part of data to be compressed is read to a symbol buffer that stores a predetermined number of symbols and the data to be compressed is input to the symbol buffer for a predetermined amount of data at a time so as to successively compress the data to be compressed.

8. The data compressing method as set forth in claim 1, wherein the counter value represents the number of symbols to be expanded corresponding to the relevant bit map.

9. A data compressing apparatus, comprising:
   input data extracting means for reading data to be compressed and extracting symbols from the read data;
   bit map generating means for generating bit maps that represent the positions of the extracted symbols in the read data;
   deleting means for deleting bits that represent that the extracted relevant symbols are not present from the last bit that represents the presence of the extracted relevant symbol to the end of the relevant bit map;
   counter value calculating means for calculating a counter value that represents the bit length of a new bit map obtained by said deleting means; and
   outputting means for combining the extracted symbol and the count value with the bit map generated by said deleting means and outputting the resultant data as compressed data,
      wherein each of the bit maps represents the positions of the extracted relevant symbols in the order of the occurrence of the read data.

10. The data compressing apparatus as set forth in claim 9, wherein the count value represents the number of symbols to be expanded corresponding to the relevant bit map.

11. The data compressing apparatus as set forth in claim 9, wherein each symbol is extracted from the data that has been read in the order of the occurrence, and
   wherein said bit map generating means, said outputting means, said deleting means, and said count value calculating means are successively executed as a compressing process for each symbol so as to compress the read data.

12. The data compressing apparatus as set forth in claim 11, further comprising:
   redundant bit deleting means for deleting the positions of symbols that have been compressed in the read data from the relevant bit map corresponding to symbols that will be compressed later,
      wherein said outputting means outputs the bit map obtained by said redundant bit deleting means as compressed data.

13. The data compressing apparatus as set forth in claim 12, further comprising:

top bit deleting means for deleting a bit that is placed at the beginning of each bit map and that represents the presence of the relevant symbols corresponding to the bit map,
wherein said outputting means outputs the bit map obtained by said top bit deleting means as compressed data.

14. The data compressing apparatus as set forth in claim 13, wherein when the same type of symbols that have been extracted are present in different positions of the data that has been read, these symbols are separately compressed.

15. The data compressing apparatus as set forth in claim 14, further comprising:

flag outputting means for combining a flag that represents whether or not the counter value of a particular symbol and a bit map thereof have been recorded as compressed data with the particular symbol and outputting the resultant data as compressed data.

16. A computer-readable storage medium storing a program that causes a computer to perform the functions of:

reading data to be compressed; extracting symbols from the read data;

representing the positions of the extracted symbols in the read data with bit maps;

deleting bits that represent that the extracted symbols in the read data with bit maps;

deleting bits that represent that the extracted relevant symbols are not present from the last bit that represents the presence of the extracted relevant symbol to the end of the relevant bit map;

generating a counter value that represents the bit length of a new bit map obtained by the deleting function; and combining the count value, the bit map and the extracted symbol and outputting the resultant data as compressed data, wherein the bit map generating function generates the bit maps, each of which represents the positions of the extracted relevant symbols in the order of the occurrence of the read data.

17. The storage medium as set forth in claim 16, further comprising the functions of:

extracting each symbol from the data that has been read in the order of the occurrence; and successively executing the functions as a compressing process for each symbol so as to compress the read data.

18. The storage medium as set forth in claim 17, wherein the count value generating function generates a count value that represents the number of symbols to be expanded corresponding to the relevant bit map.

19. The storage medium as set forth in claim 17, further comprising the function of:

deleting the positions of symbols that have been compressed in the read data from the relevant bit map for each symbol to be compressed.

20. The storage medium as set forth in claim 19, further comprising the function of:

deleting a bit that is placed at the beginning of each bit map and that represents the presence of the relevant symbols corresponding to the bit map.

21. The storage medium as set forth in claim 20, further comprising the function of:

separately compressing the same type of symbols that have been extracted when these symbols are present in different positions of the read data.

22. The storage medium as set forth in claim 21, further comprising the function of:

combining a flag that represents whether or not the counter value of a particular symbol and a bit map thereof have been recorded as compressed data with the particular symbol and outputting the resultant data as compressed data.

* * * * *

UNITED STATES PATENT AND TRADEMARK OFFICE
CERTIFICATE OF CORRECTION

PATENT NO. : 6,112,208
DATED : August 29, 2000
INVENTOR(S) : Fujio Ikegami

Page 1 of 1

It is certified that error appears in the above-identified patent and that said Letters Patent is hereby corrected as shown below:

Column 25:
Line 26, "extracting symbols from the read data;" should begin on the next line.
Line 13, insert --read -- before "data".
Line 14, delete "that has been read", Signed and Sealed this Twelfth Day of June, 2001

*Attest:*

Nicholas P. Godici

*Attesting Officer*

NICHOLAS P. GODICI
*Acting Director of the United States Patent and Trademark Office*